US010126661B2

United States Patent
Hara

(10) Patent No.: US 10,126,661 B2
(45) Date of Patent: Nov. 13, 2018

(54) EXPOSURE APPARATUS AND DEVICE FABRICATION METHOD

(71) Applicant: NIKON CORPORATION, Tokyo (JP)

(72) Inventor: Hideaki Hara, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/216,255

(22) Filed: Jul. 21, 2016

(65) Prior Publication Data

US 2016/0327874 A1   Nov. 10, 2016

Related U.S. Application Data

(60) Division of application No. 14/699,185, filed on Apr. 29, 2015, now Pat. No. 9,411,248, which is a division
(Continued)

(30) Foreign Application Priority Data

Mar. 25, 2004   (JP) ................................ 2004-089348

(51) Int. Cl.
| | | |
|---|---|---|
| *G03B 27/54* | (2006.01) | |
| *G03F 7/20* | (2006.01) | |
| *G03B 27/42* | (2006.01) | |

(52) U.S. Cl.
CPC ......... *G03F 7/70341* (2013.01); *G03B 27/42* (2013.01); *G03F 7/709* (2013.01);
(Continued)

(58) Field of Classification Search
CPC ............... G03F 7/2041; G03F 7/70325; G03F 7/70341; G03F 7/70758; G03F 7/709; G03F 7/70816; G03F 7/70833
(Continued)

(56) References Cited

U.S. PATENT DOCUMENTS

| | | |
|---|---|---|
| 3,648,587 A | 3/1972 | Stevens |
| 4,346,164 A | 8/1982 | Tabarelli et al. |
| | (Continued) | |

FOREIGN PATENT DOCUMENTS

| | | |
|---|---|---|
| CN | 1421281 A | 6/2003 |
| CN | 1573571 A | 2/2005 |
| | (Continued) | |

OTHER PUBLICATIONS

Hiroaki Kawata et al; "Fabrication of 0.2 µm Fine Patterns Using Optical Projection Lithography with an Oil Immersion Lens"; Jpn. J. Appl. Phys.; vol. 31, Part 1, No. 128; Dec. 1992; pp. 4174-4177.
(Continued)

*Primary Examiner* — Christina Riddle
(74) *Attorney, Agent, or Firm* — Oliff PLC

(57) ABSTRACT

An exposure apparatus includes a projection system having an optical element via which an exposure beam is projected; an immersion area forming member having an opening through which the exposure beam is projected, the immersion area forming member having a liquid supply inlet facing downward, a liquid recovery outlet facing downward, and a liquid supply port disposed between the liquid supply inlet and the liquid recovery outlet; a frame by which the projection system and the immersion area forming member are supported; a first vibration isolator by which transmission of vibration from the frame to the projection system is limited; and a second vibration isolator by which transmission of vibration from the immersion area forming member to the frame is limited. A liquid immersion area is formed, using the immersion area forming member, on a portion of an upper surface of a substrate, which is exposed to the exposure beam.

88 Claims, 6 Drawing Sheets

Related U.S. Application Data of application No. 13/789,308, filed on Mar. 7, 2013, now Pat. No. 9,046,790, which is a continuation of application No. 12/382,229, filed on Mar. 11, 2009, now Pat. No. 8,411,248, which is a division of application No. 10/593,802, filed as application No. PCT/JP2005/005254 on Mar. 23, 2005, now Pat. No. 8,111,373.

(52) U.S. Cl.
CPC ...... *G03F 7/70325* (2013.01); *G03F 7/70758* (2013.01); *G03F 7/70833* (2013.01); *G03F 7/2041* (2013.01)

(58) Field of Classification Search
USPC ............... 355/30, 52, 53, 55, 67, 72–77; 250/492.1, 492.2, 492.22, 548; 430/5, 8, 430/22, 30, 311, 312
See application file for complete search history.

(56) References Cited

U.S. PATENT DOCUMENTS

| | | | |
|---|---|---|---|
| 4,441,808 A | 4/1984 | Giacomelli | |
| 4,480,910 A | 11/1984 | Takanashi et al. | |
| 4,509,852 A | 4/1985 | Tabarelli et al. | |
| 5,528,100 A | 6/1996 | Igeta et al. | |
| 5,528,118 A | 6/1996 | Lee | |
| 5,610,683 A | 3/1997 | Takahashi | |
| 5,623,853 A | 4/1997 | Novak et al. | |
| 5,668,672 A | 9/1997 | Oomura | |
| 5,689,377 A | 11/1997 | Takahashi | |
| 5,707,535 A | 1/1998 | Harris | |
| 5,715,039 A | 2/1998 | Fukuda et al. | |
| 5,825,043 A | 10/1998 | Suwa | |
| 5,835,275 A | 11/1998 | Takahashi et al. | |
| 5,845,170 A | 12/1998 | Ogata | |
| 5,874,820 A | 2/1999 | Lee | |
| 5,969,441 A | 10/1999 | Loopstra et al. | |
| 5,997,963 A | 12/1999 | Davison et al. | |
| 6,191,429 B1 | 2/2001 | Suwa | |
| 6,236,634 B1 | 5/2001 | Lee et al. | |
| 6,262,796 B1 | 7/2001 | Loopstra et al. | |
| 6,310,680 B1 | 10/2001 | Taniguchi | |
| 6,391,503 B2 | 5/2002 | Ebihara | |
| 6,400,441 B1 | 7/2002 | Nishi et al. | |
| 6,417,914 B1 | 7/2002 | Li | |
| 6,438,074 B1 | 8/2002 | Aki et al. | |
| 6,446,358 B1 | 9/2002 | Mitsumori et al. | |
| 6,488,040 B1 | 12/2002 | de Larios et al. | |
| 6,538,719 B1 | 3/2003 | Takahashi et al. | |
| 6,778,257 B2 | 8/2004 | Bleeker et al. | |
| 6,781,670 B2 | 8/2004 | Krautschik | |
| 6,788,477 B2 | 9/2004 | Lin | |
| 6,811,613 B2 | 11/2004 | Kitano et al. | |
| 6,867,844 B2 | 3/2005 | Vogel et al. | |
| 6,918,989 B2 | 7/2005 | Higa | |
| 6,952,253 B2 | 10/2005 | Lof et al. | |
| 6,988,327 B2 | 1/2006 | Garcia et al. | |
| 7,053,983 B2 | 5/2006 | Tokita | |
| 7,057,702 B2 | 6/2006 | Lof et al. | |
| 7,119,874 B2 | 10/2006 | Cox et al. | |
| 7,193,681 B2 | 3/2007 | Hoogendam et al. | |
| 7,251,017 B2 | 7/2007 | Novak et al. | |
| 7,268,854 B2 | 9/2007 | Nagasaka | |
| 7,321,415 B2 | 1/2008 | Hazelton et al. | |
| 7,321,419 B2 | 1/2008 | Ebihara | |
| 7,345,742 B2 | 3/2008 | Novak et al. | |
| 7,352,434 B2 | 4/2008 | Streefkerk et al. | |
| 7,355,676 B2 | 4/2008 | Sogard | |
| 7,369,217 B2 | 5/2008 | Carroll | |
| 7,388,648 B2 | 6/2008 | Lof et al. | |
| 7,399,979 B2 | 7/2008 | Nagasaka | |
| 7,436,486 B2 | 10/2008 | Hirukawa | |
| 7,446,851 B2 | 11/2008 | Hirukawa | |
| 7,453,550 B2 | 11/2008 | Nagasaka et al. | |
| 7,456,930 B2 | 11/2008 | Hazelton et al. | |
| 7,471,371 B2 | 12/2008 | Kameyama | |
| 7,483,118 B2 | 1/2009 | Mulkens | |
| 7,486,385 B2 | 2/2009 | Ebihara | |
| 7,495,744 B2 | 2/2009 | Nagaksaka | |
| 7,505,111 B2 | 3/2009 | Hirukawa et al. | |
| 7,535,550 B2 | 5/2009 | Nagasaka | |
| 7,542,128 B2 | 6/2009 | Nagasaka et al. | |
| 7,589,821 B2 | 9/2009 | Hirukawa | |
| 7,639,343 B2 | 12/2009 | Hirukawa | |
| 7,671,963 B2 | 3/2010 | Streefkerk et al. | |
| 7,936,444 B2 | 5/2011 | Streefkerk et al. | |
| 8,089,610 B2 | 1/2012 | Hazelton et al. | |
| 8,111,373 B2 | 2/2012 | Hara | |
| 8,411,248 B2 | 4/2013 | Hara | |
| 9,046,790 B2 | 6/2015 | Hara | |
| 9,411,248 B2 | 8/2016 | Hara | |
| 2001/0006762 A1 | 7/2001 | Kwan et al. | |
| 2002/0020821 A1 | 2/2002 | Van Santen et al. | |
| 2002/0080339 A1 | 6/2002 | Takahashi | |
| 2002/0163629 A1 | 11/2002 | Switkes et al. | |
| 2003/0030916 A1 | 2/2003 | Suenaga | |
| 2003/0134574 A1 | 7/2003 | Uziel | |
| 2003/0145874 A1 | 8/2003 | Myland | |
| 2003/0174408 A1 | 9/2003 | Rostalski et al. | |
| 2004/0000627 A1 | 1/2004 | Schuster | |
| 2004/0060580 A1 | 4/2004 | Woods | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | |
| 2004/0125351 A1 | 7/2004 | Krautschik | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Maria Derksen et al. | |
| 2004/0216841 A1 | 11/2004 | Ito et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2004/0263809 A1 | 12/2004 | Nakano | |
| 2005/0007569 A1 | 1/2005 | Streefkerk et al. | |
| 2005/0018155 A1 | 1/2005 | Cox et al. | |
| 2005/0018208 A1 | 1/2005 | Levinson | |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0042554 A1 | 2/2005 | Dierichs et al. | |
| 2005/0046934 A1 | 3/2005 | Ho et al. | |
| 2005/0048220 A1 | 3/2005 | Mertens et al. | |
| 2005/0048223 A1 | 3/2005 | Pawloski et al. | |
| 2005/0068499 A1 | 3/2005 | Dodoc et al. | |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0088635 A1 | 4/2005 | Hoogendam et al. | |
| 2005/0094116 A1 | 5/2005 | Flagello et al. | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1 | 6/2005 | Mulkens et al. | |

(56) References Cited

U.S. PATENT DOCUMENTS

| | | |
|---|---|---|
| 2005/0134815 A1 | 6/2005 | Van Santen et al. |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Maria Zaal et al. |
| 2005/0225737 A1 | 10/2005 | Weissenrieder et al. |
| 2005/0233081 A1 | 10/2005 | Tokita |
| 2005/0253090 A1 | 11/2005 | Gau et al. |
| 2005/0259233 A1 | 11/2005 | Streefkerk et al. |
| 2005/0259234 A1 | 11/2005 | Hirukawa et al. |
| 2005/0264778 A1 | 12/2005 | Lof et al. |
| 2005/0270505 A1 | 12/2005 | Smith |
| 2005/0270506 A1 | 12/2005 | Streefkerk et al. |
| 2005/0280791 A1 | 12/2005 | Nagasaka et al. |
| 2005/0286032 A1 | 12/2005 | Lof et al. |
| 2006/0005860 A1 | 1/2006 | Garcia |
| 2006/0012765 A1 | 1/2006 | Kameyama |
| 2006/0023182 A1 | 2/2006 | Novak et al. |
| 2006/0023184 A1 | 2/2006 | Coon et al. |
| 2006/0023189 A1 | 2/2006 | Lof et al. |
| 2006/0038968 A1 | 2/2006 | Kemper et al. |
| 2006/0066828 A1 | 3/2006 | Klerk |
| 2006/0087630 A1 | 4/2006 | Kemper et al. |
| 2006/0098177 A1 | 5/2006 | Nagasaka |
| 2006/0114445 A1 | 6/2006 | Ebihara |
| 2006/0119807 A1 | 6/2006 | Baselmans et al. |
| 2006/0132739 A1 | 6/2006 | Ebihara |
| 2006/0132740 A1 | 6/2006 | Ebihara |
| 2006/0139613 A1 | 6/2006 | Houkes et al. |
| 2006/0146306 A1 | 7/2006 | Nagasaka et al. |
| 2006/0164615 A1 | 7/2006 | Hirukawa |
| 2006/0209278 A1 | 9/2006 | Kiuchi et al. |
| 2006/0268249 A1 | 11/2006 | Kameyama |
| 2006/0274293 A1 | 12/2006 | Nagasaka et al. |
| 2007/0109516 A1 | 5/2007 | Kameyama |
| 2007/0211234 A1 | 9/2007 | Ebihara |
| 2007/0258064 A1 | 11/2007 | Hirukawa |
| 2007/0258065 A1 | 11/2007 | Nagasaka et al. |
| 2007/0263183 A1 | 11/2007 | Nagasaka et al. |
| 2007/0263185 A1 | 11/2007 | Nagasaka et al. |
| 2008/0002166 A1 | 1/2008 | Ebihara |
| 2008/0030697 A1 | 2/2008 | Kameyama |
| 2008/0151203 A1 | 6/2008 | Hirukawa et al. |
| 2008/0297746 A1 | 12/2008 | Nagasaka |
| 2009/0002660 A1 | 1/2009 | Kiuchi |
| 2009/0009745 A1 | 1/2009 | Nagasaka |
| 2009/0015807 A1 | 1/2009 | Hirukawa et al. |
| 2009/0190112 A1 | 7/2009 | Ebihara |
| 2011/0181859 A1 | 7/2011 | Streefkerk et al. |
| 2011/0273683 A1 | 11/2011 | Streefkerk et al. |
| 2011/0279795 A1 | 11/2011 | Streefkerk et al. |

FOREIGN PATENT DOCUMENTS

| | | |
|---|---|---|
| DE | 221 563 A1 | 4/1985 |
| DE | 224 448 A1 | 7/1985 |
| EP | 0 312 066 A2 | 4/1989 |
| EP | 0 834 773 A2 | 4/1998 |
| EP | 1 052 552 A2 | 11/2000 |
| EP | 1 420 298 A2 | 5/2004 |
| EP | 1 420 299 A2 | 5/2004 |
| EP | 1 420 300 A2 | 5/2004 |
| EP | 1 477 856 A1 | 11/2004 |
| EP | 1 571 697 A1 | 9/2005 |
| EP | 1571695 A1 | 9/2005 |
| EP | 1571698 A1 | 9/2005 |
| EP | 1 598 855 A1 | 11/2005 |
| EP | 1 612 850 A1 | 1/2006 |
| EP | 1 635 382 A1 | 3/2006 |
| EP | 1 646 074 A1 | 4/2006 |
| JP | S57-153433 A | 9/1982 |
| JP | S58-202448 A | 11/1983 |
| JP | S59-19912 A | 2/1984 |
| JP | S62-65326 A | 3/1987 |
| JP | S63-157419 A | 6/1988 |
| JP | H04-305915 A | 10/1992 |
| JP | H04-305917 A | 10/1992 |
| JP | H05-62877 A | 3/1993 |
| JP | H06-53120 A | 2/1994 |
| JP | H06-124873 A | 5/1994 |
| JP | H06-188169 A | 7/1994 |
| JP | H07-220990 A | 8/1995 |
| JP | H08-136475 A | 5/1996 |
| JP | H08-166475 A | 6/1996 |
| JP | H08-171054 A | 7/1996 |
| JP | H08-316125 A | 11/1996 |
| JP | H08-330224 A | 12/1996 |
| JP | H08-334695 A | 12/1996 |
| JP | H10-3039 A | 1/1998 |
| JP | H10-20195 A | 1/1998 |
| JP | H10-163099 A | 6/1998 |
| JP | H10-214783 A | 8/1998 |
| JP | H10-255319 A | 9/1998 |
| JP | H10-303114 A | 11/1998 |
| JP | H10-340846 A | 12/1998 |
| JP | H11-135400 A | 5/1999 |
| JP | H11-176727 A | 7/1999 |
| JP | H11-260791 A | 9/1999 |
| JP | 2000-058436 A | 2/2000 |
| JP | 2000-505958 A | 5/2000 |
| JP | 2001-190996 A | 7/2001 |
| JP | 2002-134384 A | 5/2002 |
| JP | 2004-165666 A | 6/2004 |
| JP | 2004-289126 A | 10/2004 |
| JP | 2004-289127 A | 10/2004 |
| JP | 2004-343114 A | 12/2004 |
| JP | 2004-349645 A | 12/2004 |
| JP | 2005-045223 A | 2/2005 |
| JP | 2005-109426 A | 4/2005 |
| JP | 2005-109488 A | 4/2005 |
| JP | 2005-116571 A | 4/2005 |
| JP | 2005-129914 A | 5/2005 |
| JP | 2005-159322 A | 6/2005 |
| JP | 2005-183744 A | 7/2005 |
| TW | 350980 | 1/1999 |
| TW | 564474 B | 12/2003 |
| WO | 98/28665 A1 | 7/1998 |
| WO | 99/49504 A1 | 9/1999 |
| WO | 01/35168 A1 | 5/2001 |
| WO | 02/091078 A1 | 11/2002 |
| WO | 03/034479 A1 | 4/2003 |
| WO | 03/077037 A1 | 9/2003 |
| WO | 2004/019128 A2 | 3/2004 |
| WO | 2004/032160 A2 | 4/2004 |
| WO | 2004/053935 A2 | 6/2004 |
| WO | 2004/053955 A1 | 6/2004 |
| WO | 2004/055803 A1 | 7/2004 |
| WO | 2004/057589 A1 | 7/2004 |
| WO | 2004/057590 A1 | 7/2004 |
| WO | 2004/077154 A2 | 9/2004 |
| WO | 2004/081666 A1 | 9/2004 |
| WO | 2004/086468 A1 | 10/2004 |
| WO | 2004/086470 A1 | 10/2004 |
| WO | 2004/090577 A2 | 10/2004 |
| WO | 2004/090633 A2 | 10/2004 |

(56) References Cited

FOREIGN PATENT DOCUMENTS

| | | | |
|---|---|---|---|
| WO | 2004/090634 A2 | 10/2004 | |
| WO | 2004/092830 A2 | 10/2004 | |
| WO | 2004/092833 A2 | 10/2004 | |
| WO | 2004/093130 A2 | 10/2004 | |
| WO | 2004/093159 A2 | 10/2004 | |
| WO | 2004/093160 A2 | 10/2004 | |
| WO | WO 2004090634 A2 * | 10/2004 | ......... G03F 7/70341 |
| WO | 2004/095135 A2 | 11/2004 | |
| WO | 2004/105106 A1 | 12/2004 | |
| WO | 2004/107048 A2 | 12/2004 | |
| WO | 2004/114380 A1 | 12/2004 | |
| WO | 2005/001432 A2 | 1/2005 | |
| WO | 2005/003864 A2 | 1/2005 | |
| WO | 2005/006026 A2 | 1/2005 | |
| WO | 2005/008339 A2 | 1/2005 | |
| WO | 2005/013008 A2 | 2/2005 | |
| WO | 2005/015283 A1 | 2/2005 | |
| WO | 2005/017625 A2 | 2/2005 | |
| WO | 2005/019935 A2 | 3/2005 | |
| WO | 2005/022266 A2 | 3/2005 | |
| WO | 2005/024325 A2 | 3/2005 | |
| WO | 2005/024517 A2 | 3/2005 | |
| WO | 2005/034174 A2 | 4/2005 | |
| WO | 2005/050324 A2 | 6/2005 | |
| WO | 2005/054953 A2 | 6/2005 | |
| WO | 2005/054955 A2 | 6/2005 | |
| WO | 2005/059617 A2 | 6/2005 | |
| WO | 2005/059618 A2 | 6/2005 | |
| WO | 2005/059645 A2 | 6/2005 | |
| WO | 2005/059654 A1 | 6/2005 | |
| WO | 2005/062128 A2 | 7/2005 | |
| WO | 2005/064400 A2 | 7/2005 | |
| WO | 2005/064405 A2 | 7/2005 | |
| WO | 2005/069055 A2 | 7/2005 | |
| WO | 2005/069078 A1 | 7/2005 | |
| WO | 2005/069081 A2 | 7/2005 | |
| WO | 2005/071491 A2 | 8/2005 | |
| WO | 2005/074606 A2 | 8/2005 | |
| WO | 2005/076084 A1 | 8/2005 | |
| WO | 2005/081030 A1 | 9/2005 | |
| WO | 2005/081067 A1 | 9/2005 | |
| WO | 2006/007111 A2 | 1/2006 | |
| WO | 2006/009573 A1 | 1/2006 | |

OTHER PUBLICATIONS

G. Owen et al.; "1/8 μM Optical Lithography"; J. Vac. Sci. Technol. B.; vol. 10, No. 6; Nov./Dec. 1992; pp. 3032-3036.
Willi Ulrich et al.; "The Development of Dioptric Projection Lenses for DUV Lithography"; Proceedings of SPIE; vol. 4832; 2002; pp. 158-169.
Bruce W. Smith et al.; "Water Immersion Optical Lithography for the 45nm Node"; Optical Microlithography XVI; Proceedings of SPIE; vol. 5040; 2003; pp. 679-689.
Soichi Owa et al.; "Immersion Lithography; Its Potential Performance and Issues"; Optical Microlithography XVI; Proceedings of SPIE; vol. 5040; 2003; pp. 724-733.
Scott Hafeman et al.; "Simulation of Imaging and Stray Light Effects in Immersion Lithography"; Optical Microlithography XVI; Proceedings of SPIE; vol. 5040; 2003; pp. 700-712.
So-Yeon Baek et al.; "Simulation Study of Process Latitude for Liquid Immersion Lithography"; Optical Microlithography XVI; Proceedings of SPIE; vol. 5040; 2003; pp. 1620-1630.
Mark D. Feur et al.; "Projection Photolithography-Liftoff Techniques for Production of 0.2-μm Metal Patterns"; IEEE Transactions on Electron Devices; vol. 28, No. 11; Nov. 1981; pp. 1375-1378.
Dec. 19, 2008 Office Action in U.S. Appl. No. 11/635,607.
Aug. 28, 2009 Office Action in U.S. Appl. No. 11/635,607.
Apr. 1, 2009 Office Action in U.S. Appl. No. 10/593,802.
Nov. 27, 2009 Notice of Allowance in U.S. Appl. No. 10/593,802.
Feb. 2, 2010 Office Action for Japanese Patent Application No. 2006-511475.
M. Switkes et al., "Resolution Enhancement of 157 nm Lithography by Liquid Imersion"; J. Microlith, Microfab., Microsyst.; vol. 1, No. 3; Oct. 2002; pp. 225-228.
Dec. 8, 2009 Office Action in Japanese Application No. 2006-506634.
Nov. 21, 2008 Office Action in Chinese Application No. 200480009675.7.
Oct. 9, 2009 Office Action in Chinese Application No. 200480009675.7.
Dec. 20, 2006 Australian Invitation to Respond to Written Opinion in Singapore Application No. 200506412-6.
Aug. 17, 2007 Australian Examination Report in Singapore Application No. 200506412-6.
Nov. 2, 2006 Office Action in U.S. Appl. No. 11/237,799.
Mar. 24, 2009 Advisory Action in U.S. Appl. No. 11/701,378.
Mar. 23, 2010 Notice of Allowance in U.S. Appl. No. 11/701,378.
Mar. 31, 2010 Supplementary Notice of Allowance in U.S. Appl. No. 11/701,378.
Dec. 8, 2009 Office Action in Japanese Application No. 2006-509568.
Nov. 20, 2009 Notice of Allowance in Chinese Application No. 200480009673.8.
Sep. 23, 2008 Supplemental European Search Report in European Application No. 04759085.6.
Apr. 15, 2010 Office Action in U.S. Appl. No. 11/819,446.
Apr. 15, 2010 Office Action in U.S. Appl. No. 11/819,447.
May 3, 2010 Notice of Allowance in U.S. Appl. No. 11/819,689.
May 4, 2010 Notice of Allowance in U.S. Appl. No. 11/819,691.
Oct. 13, 2005 International Search Report and Written Opinion in Application No. PCT/US04/09994.
May 11, 2010 Notice of Allowance in Japanese Application No. 2006-511475.
Mar. 25, 2010 Notice of Allowance in U.S. Appl. No. 10/593,802.
Aug. 9, 2005 International Search Report and Written Opinion in Application No. PCT/JP2005/005254.
Feb. 27, 2007 Office Action in U.S. Appl. No. 11/239,493.
Jun. 27, 2007 Notice of Allowance in U.S. Appl. No. 11/239,493.
Feb. 15, 2008 Notice of Allowance in U.S. Appl. No. 11/239,493.
Notice of Allowance in U.S. Appl. No. 11/701,378; dated Jul. 14, 2010.
Office Action issued in Chinese Application No. CN200480009675.7; dated Jul. 26, 2010.
Notice of Allowance for U.S. Appl. No. 10/593,802; dated Sep. 3, 2010.
Notice of Allowance issued in U.S. Appl. No. 11/635,607 dated Nov. 10, 2010.
Notice of Allowance issued for U.S. Appl. No. 11/635,607 dated Dec. 21, 2010.
Notice of Allowance issued for U.S. Appl. No. 10/593,802 dated Dec. 23, 2010.
Jul. 18, 2011 Office Action issued in U.S. Appl. No. 12/382,661.
Dec. 20, 2012 Office Action issued in Korean Patent Application No. 10-2012-7025345.
Nov. 6, 2012 Office Action issued in Japanese Patent Application No. 2010-087336.
Nov. 16, 2010 Notice of Allowance issued in Japanese Patent Application No. 2006-509568.
Nov. 16, 2010 Office Action issued in Japanese Patent Application No. 2006-506634.
Dec. 13, 2010 Notice of Allowance issued in U.S. Appl. No. 11/819,446.
Dec. 13, 2010 Notice of Allowance issued in U.S. Appl. No. 11/819,447.
Jan. 29, 2015 Office Action issued in U.S. Appl. No. 14/463,066.
Feb. 20, 2015 Office Action issued in U.S. Appl. No. 14/324,607.
Mar. 26, 2015 Office Action issued in Korean Application No. 2014-7008125.
Mar. 25, 2013 Office Action issued in European Application No. 04759085.6.
Oct. 30, 2015 Search Report issued in European Application No. 15162758.5.
Nov. 3, 2015 Search Report issued in European Application No. 15162756.9.

(56) References Cited

OTHER PUBLICATIONS

Nov. 24, 2015 Office Action issued in Korean Application No. 10-2014-7032263.
Dec. 8, 2015 Office Action issued in European Application No. 15162756.9.
Feb. 29, 2016 Office Action issued in Chinese Patent Application No. 201410838351.X.
Aug. 22, 2008 Office Action in Chinese Application No. 200480009673.8.
May 8, 2009 Office Action in Chinese Application No. 200480009673.8.
Oct. 1, 2008 Supplementary European Search Report for EP 04 75 8599.
Nov. 30, 2006 International Search Report and Written Opinion for PCT/IB04/02704.
Nov. 7, 2006 Australian Search Report and Written Opinion for Singapore Patent Application No. 200506412-6.
Jan. 25, 2006 Office Action in U.S. Appl. No. 11/237,799.
Oct. 18, 2006 Notice of Allowance in U.S. Appl. No. 11/237,799.
Apr. 10, 2007 Notice of Allowance in U.S. Appl. No. 11/237,799.
Aug. 29, 2007 Notice of Allowance in U.S. Appl. No. 11/237,799.
Aug. 1, 2006 Office Action in U.S. Appl. No. 11/253,597.
Mar. 23, 2007 Notice of Allowance in U.S. Appl. No. 11/253,597.
Apr. 4, 2006 Office Action in U.S. Appl. No. 11/329,269.
Dec. 7, 2006 Notice of Allowance in U.S. Appl. No. 11/329,269.
May 29, 2007 Notice of Allowance in U.S. Appl. No. 11/329,269.
Nov. 14, 2007 Notice of Allowance in U.S. Appl. No. 11/329,269.
Jun. 16, 2009 Office Action in U.S. Appl. No. 11/701,378.
Jan. 8, 2009 Office Action in U.S. Appl. No. 11/701,378.
Apr. 17, 2008 Office Action in U.S. Appl. No. 11/701,378.
Oct. 16, 2007 Office Action in U.S. Appl. No. 11/819,089.
Jul. 25, 2008 Notice of Allowance in U.S. Appl. No. 11/819,089.
Jul. 24, 2007 Office Action in U.S. Appl. No. 11/705,001.
Oct. 30, 2007 Notice of Allowance in U.S. Appl. No. 11/705,001.
Feb. 1, 2006 Office Action in U.S. Appl. No. 11/236,713.
Mar. 23, 2007 Notice of Allowance in U.S. Appl. No. 11/236,713.
Oct. 17, 2008 Office Action in U.S. Appl. No. 11/819,446.
Jul. 9, 2009 Office Action in U.S. Appl. No. 11/819,446.
Oct. 16, 2008 Office Action in U.S. Appl. No. 11/819,691.
Jul. 9, 2009 Office Action in U.S. Appl. No. 11/819,691.
Oct. 16, 2008 Office Action in U.S. Appl. No. 11/819,689.
Jul. 9, 2009 Office Action in U.S. Appl. No. 11/819,689.
Oct. 16, 2008 Office Action in U.S. Appl. No. 11/819,447.
Jul. 9, 2009 Office Action in U.S. Appl. No. 11/819,447.
B.J. Lin, Emerging Lithographic Technologies VI, Proceedings of SPIE, vol. 4688 (2002), "Semiconductor Foundry, Lithography, and Partners", pp. 11-24.
M. Switkes et al., Optical Microlithography XV, Proceedings of SPIE, vol. 4691 (2002), "Resolution Enhancement of 157 nm Lithography by Liquid Immersion", pp. 459-465.
M. Switkes et al., .J. Microlith., Microfab., Microsyst., vol. 1 No. 3, Oct. 2002, Society of Photo-Optical Instrumentation Engineers, "Resolution enhancement of 157 nm lithography by liquid immersion", pp. 1-4.
Soichi Owa et al., Nikon Corporation, 3rd 157 nm symposium, Sep. 4, 2002, "Nikon F2 Exposure Tool", 25 pages (slides 1 25).
Nikon Corporation, Immersion Lithography Workshop, Dec. 11, 2002, 24 pages (slides 1-24).
Soichi Owa et al., Nikon Corporation, NGL Workshop, Jul. 10, 2003, :Potential performance and feasibility of immersion lithography, 33 pages, slides 1-33.
Soichi Owa et al., Nikon Corporation, Immersion Workshop, Jan. 27, 2004, "Update on 193 nm immersion exposure tool", 38 pages (slides 1-38).
Soichi Owa et al., Nikon Corporation, Litho Forum, Jan. 28, 2004, "Update on 193 nm immersion exposure tool", 51 pages (slides 1-51).
Hiroaki Kawata et al; "Optical Projection Lithography Using lenses with Numerical Apertures Greater Than Unity"; Microelectronic Engineering; vol. 9; 1989; pp. 31-36.
Aug. 1, 2016 Search Report issued in European Patent Application No. 16151255.3.
Aug. 4, 2016 Office Action issued in U.S. Appl. No. 14/955,909.
Sep. 21, 2016 Office Action issued in Taiwanese Patent Application No. 104127306.
Jun. 30, 2017 Office Action issued in U.S. Appl. No. 15/585,624.
Jun. 26, 2017 Office Action issued in Taiwanese Application No. 106109736.
Sep. 19, 2017 Extended Search Report issued in European Application No. 17161308.6.
Jan. 12, 2011 Office Action issued in Chinese Patent Application No. 201010113626.5.
Jan. 14, 2011 Office Action issued in Korean Patent Application No. 2005-7019303.
Jan. 14, 2011 Office Action issued in Korean Patent Application No. 2005-7019305.
Jan. 3, 2011 Search and Examination Report issued in Singaporean Patent Application No. 200800250-3.
Jan. 13, 2011 Search and Examination Report issued in Singaporean Patent Application No. 200800251-1.
Feb. 22, 2011 Office Action issued in Japanese Patent Application No. 2006-506634.
Mar. 31, 2011 Office Action issued in Chinese Patent Application No. 200480009675.7.
Dec. 2, 2011 Notice of Allowance issued in U.S. Appl. No. 10/593,802.
Jan. 9, 2012 Notice of Allowance issued in U.S. Appl. No. 11/635,607.
Jun. 25, 2012 Office Action issued in TW 097127865.
Jul. 27, 2012 Office Action issued in European Patent Application No. 04 758 599.7.
Oct. 16, 2012 Office Action issued in U.S. Appl. No. 13/529,663.
Aug. 14, 2012 Office Action issued in Japanese Application No. 2010-026002.
Jan. 25, 2012 Office Action issued in U.S. Appl. No. 12/382,229.
Nov. 28, 2012 Notice of Allowance issued in U.S. Appl. No. 12/382,229.
Mar. 12, 2013 Office Action issued in European Patent Application No. 04758599.7.
Apr. 19, 2013 Office Action issued in U.S. Appl. No. 13/067,464.
Mar. 5, 2013 Office Action issued in Japanese Patent Application No. 2010-087336.
May 17, 2013 Office Action issued in U.S. Appl. No. 13/529,663.
May 29, 2013 Office Action issued in Korean Patent Application No. 10-2012-7009421.
Jul. 11, 2013 Office Action issued in U.S. Appl. No. 12/926,029.
Sep. 11, 2013 Office Action issued in U.S. Appl. No. 13/067,464.
Sep. 25, 2013 Office Action issued in Korean Patent Application No. 10-2012-7021786.
Oct. 14, 2013 Office Action issued in European Patent Application No. 13180845.3.
Nov. 5, 2013 Office Action issued in European Patent Application No. 13180843.8.
Dec. 19, 2013 Office Action issued in U.S. Appl. No. 13/529,663.
Dec. 31, 2013 Office Action issued in U.S. Appl. No. 12/926,029.
Jan. 8, 2014 Office Action issued in U.S. Appl. No. 13/067,464.
Apr. 1, 2014 Office Action issued in Japanese Patent Application No. 2013-146581.
Apr. 2, 2014 Office Action issued in European Patent Application No. 13196627.7.
Jul. 23, 2014 Office Action issued in European Patent Application No. 04758599.7.
Jul. 23, 2014 Office Action issued in European Patent Application No. 13180843.8.
Jul. 23, 2014 Office Action issued in European Patent Application No. 13180845.3.
Jul. 23, 2014 Office Action issued in European Patent Application No. 13196627.7.
Oct. 22, 2014 Office Action issued in Chinese Patent Application No. 201310339659.5.
Oct. 29, 2014 Office Action issued in Chinese Patent Application No. 201310236773.5.
Nov. 5, 2014 Office Action issued in Chinese Patent Application No. 201310235130.9.

(56) References Cited

OTHER PUBLICATIONS

Jun. 21, 2013 Office Action issued in U.S. Appl. No. 13/789,308.
Sep. 12, 2014 Office Action issued in U.S. Appl. No. 13/789,308.
Jan. 26, 2015 Notice of Allowance issued in U.S. Appl. No. 13/789,308.
Nov. 5, 2015 Office Action issued in U.S. Appl. No. 14/699,185.
Apr. 6, 2016 Notice of Allowance issued in U.S. Appl. No. 14/699,185.
May 11, 2018 Office Action issued in U.S. Appl. No. 15/879,755.
Apr. 17, 2018 Office Action issued in Japanese Application No. 2016-227059.
Jun. 22, 2018 Search Report issued in European Application No. 17206979.1.
Jun. 25, 2018 Office Action issued in U.S. Appl. No. 15/981,243.

\* cited by examiner

EXPOSURE APPARATUS AND DEVICE FABRICATION METHOD

This is a Division of U.S. application Ser. No. 14/699,185 filed Apr. 29, 2015 (now U.S. Pat. No. 9,411,248), which in turn is a Division of U.S. application Ser. No. 13/789,308 filed Mar. 7, 2013 (now U.S. Pat. No. 9,046,790), which is a Continuation of U.S. application Ser. No. 12/382,229 filed Mar. 11, 2009 (now U.S. Pat. No. 8,411,248), which is a Division of U.S. application Ser. No. 10/593,802 filed Sep. 21, 2006 (now U.S. Pat. No. 8,111,373), which is the U.S. National Stage of PCT/JP2005/005254 filed Mar. 23, 2005, which claims the benefit of Japanese Patent Application No. 2004-89348, filed on Mar. 25, 2004. The disclosures of the prior applications are hereby incorporated by reference herein in their entirety.

TECHNICAL FIELD

The present invention relates to an exposure apparatus that exposes a substrate via a liquid, and a device fabrication method that uses this exposure apparatus.

BACKGROUND ART

Semiconductor devices and liquid crystal display devices are fabricated by a so-called photolithography technique, wherein a pattern formed on a mask is transferred onto a photosensitive substrate. An exposure apparatus used by this photolithographic process has a mask stage that supports the mask, and a substrate stage that supports the substrate, and transfers the pattern of the mask onto the substrate via a projection optical system while successively moving the mask stage and the substrate stage. There has been demand in recent years for higher resolution projection optical systems in order to handle the much higher levels of integration of device patterns. The shorter the exposure wavelength used and the larger the numerical aperture of the projection optical system, the greater the resolution of the projection optical system. Consequently, the exposure wavelength used in exposure apparatuses has shortened year by year, and the numerical aperture of projection optical systems has also increased. Furthermore, the currently mainstream exposure wavelength is the 248 nm KrF excimer laser, but an even shorter wavelength 193 nm ArF excimer laser is also being commercialized. In addition, like resolution, the depth of focus (DOF) is also important when performing an exposure. The following equations respectively express the resolution R and the depth of focus $\delta$.

$$R = k_1 \cdot \lambda / NA \quad (1)$$

$$\delta = \pm k_2 \cdot \lambda / NA^2 \quad (2)$$

Therein, $\lambda$ is the exposure wavelength, NA is the numerical aperture of the projection optical system, and $k_1$ and $k_2$ are the process coefficients. Equations (1) and (2) teach that shortening the exposure wavelength $\lambda$ increases the resolution R, and that increasing the numerical aperture NA decreases the depth of focus $\delta$.

If the depth of focus $\delta$ becomes excessively small, then it will become difficult to align the surface of the substrate with the image plane of the projection optical system, and there will be a risk of insufficient margin of focus during the exposure operation. Accordingly, a liquid immersion method has been proposed, as disclosed in, for example, Patent Document 1 below, as a method to substantially shorten the exposure wavelength and increase the depth of focus. This liquid immersion method fills a liquid, such as water or an organic solvent, between the tip surface (lower surface) of the projection optical system and the surface of the substrate, thus taking advantage of the fact that the wavelength of the exposure light in a liquid is 1/n that of in air (where n is the refractive index of the liquid, normally approximately 1.2-1.6), thereby improving the resolution as well as increasing the depth of focus by approximately n times. The disclosure of the following pamphlet is hereby incorporated by reference in its entirety to the extent permitted by the national laws and regulations of the designated states (or elected states) designated by the present international patent application.

[PATENT DOCUMENT 1] International Publication WO99/49504

Incidentally, although nozzles are used for the supply and collection of the liquid in the abovementioned related art, there is a possibility that the pattern image projected onto the substrate via the projection optical system and the liquid will degrade if vibrations produced by the nozzles are transmitted to, for example, the projection optical system. In addition, there is also a possibility that the position of the nozzles will fluctuate due to changes in the pressure of the liquid, and there is also a possibility that it will become difficult to supply and collect the liquid in the desired state.

DISCLOSURE OF INVENTION

The present invention was created considering such circumstances, and has an object to provide an exposure apparatus that can supply and collect a liquid in a desired state, and can suppress the degradation of a pattern image projected onto a substrate, and a device fabrication method that uses this exposure apparatus.

To solve the abovementioned problems, the present invention adopts the following constitution, associated with FIG. 1 through FIG. 6, which depict the embodiments.

An exposure apparatus of the present invention is an exposure apparatus that exposes a substrate via a liquid, including: a nozzle member having at least any one of a supply outlet that supplies a liquid and a collection inlet that collects a liquid; and a vibration isolating mechanism that supports the nozzle member and vibrationally isolates the nozzle member from a prescribed support member.

According to the present invention, because the vibration isolating mechanism is provided that supports the nozzle member and vibrationally isolates it from the prescribed support member, it is possible to suppress the impact on the exposure accuracy due to vibrations generated by the nozzle member. Accordingly, it is possible to prevent the degradation of the pattern image projected onto the substrate.

An exposure apparatus of the present invention is an exposure apparatus that exposes a substrate via a liquid, including: a nozzle member having at least any one of a supply outlet that supplies a liquid and a collection inlet that collects a liquid; a support member that supports the nozzle member, and an adjustment mechanism that adjusts a positional relationship between the support member and the nozzle member.

According to the present invention, the adjustment mechanism can adjust the position of the nozzle member with respect to the support member, and the liquid for forming the immersion area can therefore be supplied and collected in a state in which the nozzle member is disposed at an optimal position. Accordingly, the immersion area can be satisfactorily formed, and immersion exposure can be performed with good accuracy.

An exposure apparatus of the present invention is an exposure apparatus that exposes a substrate via an optical system and a liquid, including: a nozzle member supported by a prescribed support member, and having at least any one of a supply outlet that supplies a liquid and a collection inlet that collects a liquid; and an adjustment mechanism that adjusts a positional relationship between the optical system and the nozzle member.

According to the present invention, the adjustment mechanism can adjust the position of the nozzle member with respect to the optical system, and the liquid for forming the immersion area can therefore be supplied and collected in a state in which the nozzle member is disposed at an optimal position. Accordingly, the immersion area can be satisfactorily formed, and immersion exposure can be performed with good accuracy.

An exposure apparatus of the present invention is an exposure apparatus that exposes a substrate via a liquid, including: a nozzle member supported by a prescribed support member, and having at least any one of a supply outlet that supplies a liquid and a collection inlet that collects a liquid; a substrate stage that holds the substrate; and an adjustment mechanism that has a drive apparatus that drives the nozzle member with respect to the support member, and that adjusts a positional relationship between the substrate stage and the nozzle member.

According to the present invention, the adjustment mechanism can adjust the position of the nozzle member with respect to the substrate stage, and the liquid for forming the immersion area can therefore be supplied and collected in a state in which the nozzle member is disposed at an optimal position. Accordingly, the immersion area can be satisfactorily formed, and immersion exposure can be performed with good accuracy.

An exposure apparatus according to another aspect of the present invention is an exposure apparatus that exposes a substrate via a liquid, having: a nozzle member that has at least any one of a supply outlet that supplies a liquid and a collection inlet that collects a liquid; in which, at least one part of the nozzle member is movable in the optical axis direction of the exposure light that exposes the substrate.

A device fabrication method of the present invention uses an exposure apparatus as recited above. According to the present invention, because the pattern image can be transferred onto a substrate with good accuracy, a device having the desired performance can be manufactured.

According to the present invention, a liquid can be supplied and collected in a desired state, and the degradation of a pattern image projected onto a substrate can be suppressed.

BEST MODE FOR CARRYING OUT THE INVENTION

Figure 1:
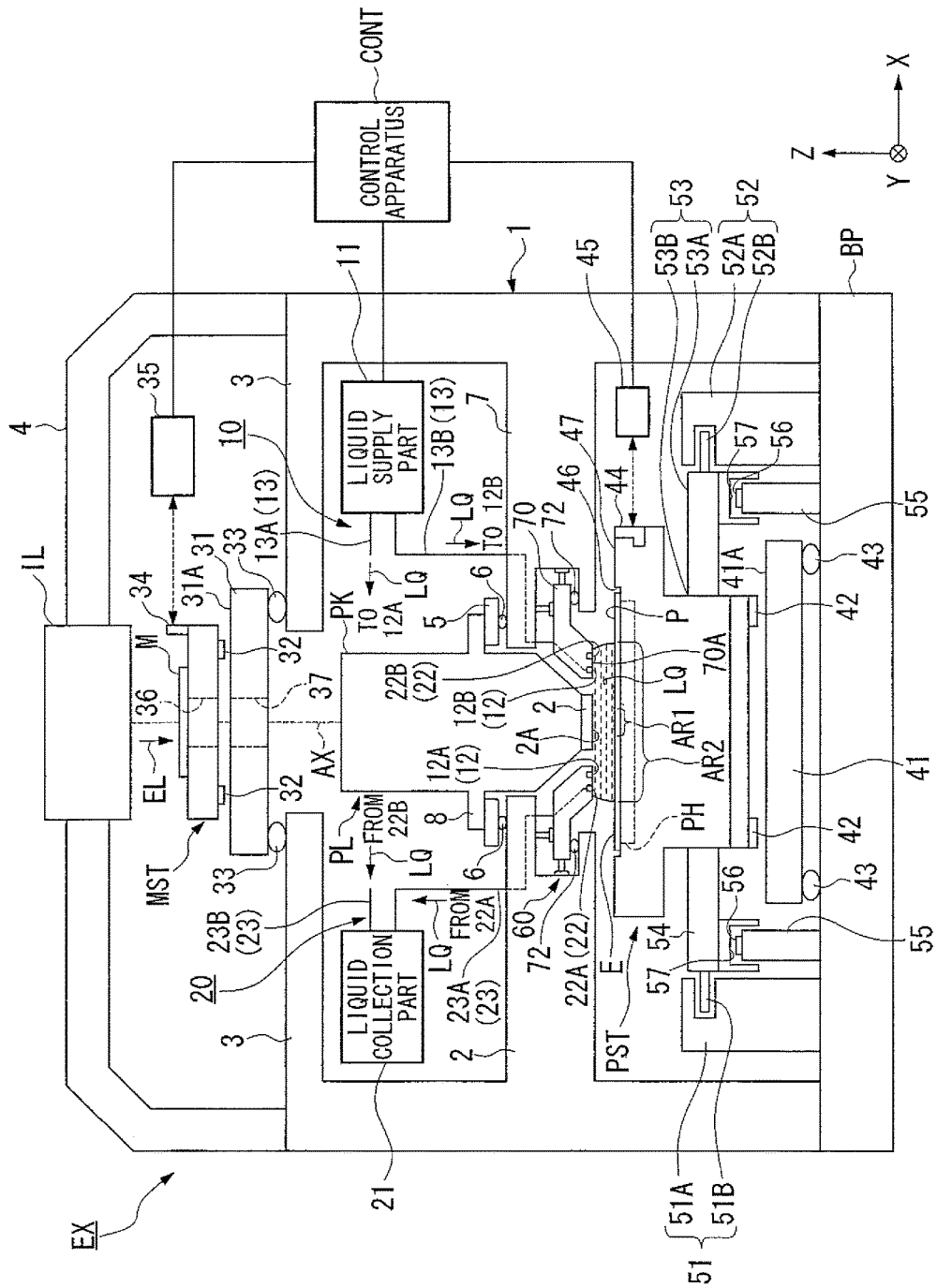
FIG. 1 is a schematic block diagram that depicts one embodiment of an exposure apparatus of the present invention.

The following explains the exposure apparatus and device fabrication method of the present invention, referencing the drawings. FIG. 1 is a schematic block diagram that depicts one embodiment of the exposure apparatus of the present invention.

In FIG. 1, the exposure apparatus EX includes: a mask stage MST that supports a mask M; a substrate stage PST that supports a substrate P; an illumination optical system IL that illuminates with an exposure light EL the mask M supported by the mask stage MST; a projection optical system PL that projects and exposes a pattern image of the mask M illuminated by the exposure light EL onto the substrate P supported by the substrate stage PST; and a control apparatus CONT that provides overall control of the operation of the entire exposure apparatus EX.

The control apparatus CONT is connected to various measuring means of the exposure apparatus EX (e.g., interferometers 35, 45, a focus leveling detection system, nozzle position measuring instruments 84-86, and the like), drive apparatuses (e.g., a mask stage drive apparatus, a substrate stage drive apparatus, nozzle drive apparatuses 61-63, and the like), and the like, and is constituted so that it is possible to transmit measurement results and drive instructions thereamong.

Furthermore, the exposure apparatus EX includes a main column 1 that supports the mask stage MST and the projection optical system PL. The main column 1 is installed on a base plate BP mounted horizontally on the floor. On the main column 1 is formed an inwardly protruding upper side step part 3 and lower side step part 7.

The exposure apparatus EX of the present embodiment is a liquid immersion type exposure apparatus that applies the liquid immersion method to substantially shorten the exposure wavelength, improve the resolution, as well as substantially increase the depth of focus, and includes a liquid supply mechanism 10 that supplies a liquid LQ on the substrate P, and a liquid collection mechanism 20 that collects the liquid LQ on the substrate P. At least during the transfer of the pattern image of the mask M onto the substrate P, the exposure apparatus EX forms the immersion area AR2, by the liquid LQ supplied from the liquid supply mechanism 10, in one part on the substrate P that includes a projection area AR1 of the projection optical system PL. Specifically, the exposure apparatus EX exposes the substrate P by filling the liquid LQ between an optical element 2 of the image plane side tip part of the projection optical system PL and the surface of the substrate P; and then projecting the pattern image of the mask M onto the substrate P via the liquid LQ between this projection optical system PL and the substrate P, and via the projection optical system PL.

As an example, the present embodiment explains a case of using, as the exposure apparatus EX, a scanning type exposure apparatus (a so-called scanning stepper) that, while synchronously moving the mask M and the substrate P in mutually different orientations (reverse directions) in the scanning direction, exposes the substrate P with the pattern formed on the mask M. In the following explanation, the direction that coincides with an optical axis AX of the projection optical system PL is the Z axial direction, the direction in which the mask M and the substrate P synchronously move in the plane perpendicular to the Z axial direction (the scanning direction) is the X axial direction, and the direction perpendicular to the Z axial direction and the X axial direction (the non-scanning direction) is the Y axial direction. In addition, the rotational (inclined) directions around the X, Y, and Z axes are the θX, θY, θZ directions, respectively. Furthermore, "substrate" herein includes one in which a semiconductor wafer is coated with a photoresist, which is a photosensitive material, and "mask" includes a reticle in which the pattern of a device which is reduced and projected onto the substrate is formed.

The illumination optical system IL is supported by a support column 4 fixed to an upper part of the main column 1. The illumination optical system IL illuminates with the exposure light EL the mask M supported by the mask stage MST, and has: an exposure light source; an optical integrator that uniformizes the intensity of the luminous flux emitted from the exposure light source; a condenser lens that condenses the exposure light EL from the optical integrator, a relay lens system; a variable field stop that sets to a slit shape an illumination region on the mask M illuminated by the exposure light EL; and the like. The illumination optical system IL illuminates the prescribed illumination region on the mask M with the exposure light EL, having a uniform illumination intensity distribution. Examples of light used as the exposure light EL emitted from the illumination optical system IL include: deep ultraviolet light (DUV light), such as bright lines (g, h, and i lines) in the ultraviolet region emitted from a mercury lamp for example, and KrF excimer laser light (248 nm wavelength); and vacuum ultraviolet light (VUV light), such as ArF excimer laser light (193 nm wavelength) and $F_2$ laser light (157 nm wavelength). ArF excimer laser light is used in the present embodiment.

In the present embodiment, pure water is used as the liquid LQ. Pure water is capable of transmitting not only ArF excimer laser light, but also deep ultraviolet light (DUV light), such as the bright lines (g, h, and i lines) in the ultraviolet region emitted from, for example, a mercury lamp, and KrF excimer laser light (248 nm wavelength).

The mask stage MST supports the mask M, and includes an aperture part 36 at its center part through which passes the pattern image of the mask M. A mask base plate 31 is supported on the upper side step part 3 of the main column 1 via a vibration isolating unit 33. An aperture part 37 through which passes the pattern image of the mask M is also formed at the center part of the mask base plate 31. A plurality of gas bearings (air bearings) 32, which are non-contact bearings, is provided at a lower surface of the mask stage MST.

The mask stage MST is noncontactually supported by the air bearings 32 to an upper surface (guide surface) 31A of the mask base plate 31, and, by the mask stage drive apparatus, such as a linear motor, the mask stage MST is two dimensionally movable within a plane perpendicular to the optical axis AX of the projection optical system PL, i.e., within the XY plane, and is micro-rotatable about the θZ direction. A movable mirror 34 is provided at a prescribed position on the +X side on the mask stage MST. In addition, the laser interferometer 35 is provided at a position opposing the movable mirror 34. Likewise, although not shown, a movable mirror is also provided on the +Y side on the mask stage MST, and a laser interferometer is provided at a position opposing thereto. The laser interferometer 35 measures in real time the position, in the two dimensional direction, and the rotational angle in the θZ direction (depending on the case, also including the rotational angles in the θX, θY directions) of the mask M on the mask stage MST, and outputs the measurement results to the control apparatus CONT. The control apparatus CONT is connected to the laser interferometer 35 and the mask stage drive apparatus, and drives the mask stage drive apparatus based on the measurement results of the laser interferometer 35, thereby positioning the mask M, which is supported by the mask stage MST.

The projection optical system PL projects and exposes the pattern of the mask M onto the substrate P with a prescribed projection magnification β, has a plurality of optical elements, including the optical element (lens) 2 provided at the terminal part on the substrate P side (the image plane side of the projection optical system PL), and these optical elements are supported by a lens barrel PK. In the present embodiment, the projection optical system PL is a reduction system having a projection magnification β of, for example, ¼ or ⅕. Furthermore, the projection optical system PL may be either a unity magnification system or an enlargement system. In addition, the optical element (lens) 2 of the tip part of the projection optical system PL of the present embodiment is attachably and detachably (replaceably) provided to and from the lens barrel PK, and the liquid LQ of the immersion area AR2 contacts the optical element 2.

The optical element 2 is made of fluorite. Because fluorite has a high affinity for water, the substantial entire surface of a liquid contact surface 2A of the optical element 2 can be made to closely contact the liquid LQ. Namely, because the liquid (water) LQ having a high affinity for the liquid contact surface 2A of the optical element 2 is supplied in the present embodiment, the characteristics of close contact between the liquid LQ and the liquid contact surface 2A of the optical element 2 are excellent, and the optical path between the optical element 2 and the substrate P can therefore be reliably filled with the liquid LQ. Furthermore, the optical element 2 may also be made of quartz, which has a high affinity for water. In addition, the liquid contact surface 2A of the optical element 2 may also be treated to make it hydrophilic (lyophilic), such as by depositing $MgF_2$, $Al_2O_3$, and $SiO_2$, thereby improving its affinity for the liquid LQ.

An outer circumferential part of the lens barrel PK is provided with a flange part 8. In addition, a lens barrel base plate 5 is supported via a vibration isolating unit 6 on an upper surface of the lower side step part 7 of the main column 1. Furthermore, engaging the flange part 8 to the lens barrel base plate 5 causes the lens barrel PK to be supported by the lens barrel base plate 5. The projection optical system PL is constituted so that it is supported by the lower side step part 7 of the main column 1 via the lens barrel base plate 5 and the vibration isolating unit 6.

The substrate stage PST is movably provided so that it supports the substrate P via a substrate holder PH. A recessed part 46 is provided on the substrate stage PST, and the substrate holder PH is disposed in the recessed part 46. An upper surface 47 of the substrate stage PST outside of the recessed part 46 is a flat surface (flat part) so that it is substantially the same height as (and flush with) the surface of the substrate P supported by the substrate holder PH.

By providing the upper surface 47 around the substrate P and substantially flush with the surface of the substrate P, the liquid LQ can be held on the image plane side of the projection optical system PL and the immersion area AR2 can be favorably formed, even during immersion exposure of an edge area E of the substrate P. In addition, although there is a gap of approximately 0.1-2.0 mm between the upper surface 47 and the edge part of the substrate P, hardly any of the liquid LQ flows into that gap due to the surface tension of the liquid LQ, and the liquid LQ can be held below the projection optical system PL by the upper surface 47 even when exposing the vicinity of the circumferential edge of the substrate P.

The upper surface 47 of the substrate stage PST is treated to make it water repellent, and is therefore water repellent. Examples of water repellent treatment for the upper surface 47 include coating with a liquid repellent material, e.g., a fluororesin material or an acrylic resin material, as well as affixing a thin film made of the abovementioned liquid repellent material. A material that is insoluble in the liquid LQ is used as the liquid repellent material to make it water repellent. Furthermore, all or part of the substrate stage PST may be made of a water repellent material, such as a fluororesin like, for example, polytetrafluoroethylene (Teflon™).

A plurality of gas bearings (air bearings) 42, which are noncontact bearings, is provided at the lower surface of the substrate stage PST. A substrate base plate 41 is supported on the base plate BP via a vibration isolating unit 43. The substrate stage PST is noncontactually supported by the air bearings 42 on an upper surface (guide surface) 41A of the substrate base plate (base part) 41, and, by the substrate stage drive apparatus, which includes linear motors 51, 52, 53 and the like, which are discussed later, the substrate stage PST is two dimensionally moveable within a plane perpendicular to the optical axis AX of the projection optical system PL, i.e., within the XY plane, and is also microrotatable about the θZ direction. Furthermore, the substrate stage PST is movably provided also in the Z axial direction, the θX direction, and the θY direction.

The substrate stage PST is supported freely movable in the X axial direction by an X guide stage 54. The substrate stage PST is noncontactually supported by a magnetic guide having an actuator and a magnet that maintains a gap of a prescribed size in the Z axial direction with respect to the X guide stage 54. The substrate stage PST is movable by a prescribed stroke in the X axial direction by the X linear motor 53 while being guided by the X guide stage 54. The X linear motor 53 has a stator 53A provided in the X guide stage 54 extending in the X axial direction, and a slider 53B provided corresponding to this stator 53A and fixed to the substrate stage PST. Furthermore, the substrate stage PST moves in the X axial direction by driving the slider 53B with respect to the stator 53A. The X linear motor 53 moves the substrate stage PST in the X axial direction in a state noncontactually supported by the X guide stage 54.

The ends of the X guide stage 54 in the longitudinal direction are provided with the pair of Y linear motors 51, 52 capable of moving this X guide stage 54 along with the substrate stage PST in the Y axial direction. The Y linear motors 51, 52 respectively have sliders 51B, 52B, provided at both ends of the X guide stage 54 in the longitudinal direction, and stators 51A, 52A provided corresponding to these sliders 51B, 52B. The stators 51A, 52A are supported on the base plate BP. Furthermore, the X guide stage 54 along with the substrate stage PST moves in the Y axial direction by driving the sliders 51B, 52B with respect to the stators 51A, 52A. In addition, the X guide stage 54 can also be rotated in the θZ direction by adjusting the respective drives of the Y linear motors 51, 52. Accordingly, the substrate stage PST is movable substantially integrally with the X guide stage 54 in the Y axial direction and the θZ direction by these linear motors 51, 52.

Guide parts 55, 55 that guide the movement of the X guide stage 54 in the Y axial direction are provided respectively on both sides in the X axial direction, sandwiching the substrate base plate 41. Each guide part 55 is supported on the base plate BP. Further, a U-shaped guided member 57 is provided on the lower surface of the X guide stage 54 at each end of the X guide stage 54 in the longitudinal direction. Each guide part 55 is provided so that it mates with the guided member 57, and so that the upper surface (the guide surface) of each guide part 55 opposes the inner surface of the guided member 57. The guide surface of each guide part 55 is provided with a gas bearing (air bearing) 56, which is a noncontact bearing, and the X guide stage 54 is noncontactually supported by the guide surface.

The substrate stage drive apparatus, which includes the abovementioned linear motors 51, 52, 53, is connected to the control apparatus CONT, and the control apparatus CONT controls the substrate stage drive apparatus. In addition, the exposure apparatus EX has a focus leveling detection system (not shown) that detects the position of the surface of the substrate P supported by the substrate stage PST. The focus leveling detection system is connected to the control apparatus CONT, and the control apparatus CONT controls the angle of inclination and the focus position (Z position) of the substrate P on the substrate stage PST based on the detection result of the focus leveling detection system, and aligns the surface of the substrate P with the image plane of the projection optical system PL by an auto focus system and an auto leveling system.

The substrate stage PST is provided with a moveable mirror 44. The upper surface of the moveable mirror 44 is substantially flush with the upper surface 47 of the substrate stage PST. The same as the upper surface 47 of the substrate stage PST, the upper surface of the moveable mirror 44 is also treated to make it water repellent, and is therefore water repellent. In addition, the laser interferometer 45 is provided at a position opposing the moveable mirror 44. The laser interferometer 45 measures in real time the rotational angle and the position in the two dimensional direction of the substrate P on the substrate stage PST, and the measurement results are outputted to the control apparatus CONT. The laser interferometer 45 and the substrate stage drive apparatus are connected to the control apparatus CONT, and the control apparatus CONT positions the substrate P, supported by the substrate stage PST, in the XY plane by driving the substrate stage drive apparatus based on the measurement result of the laser interferometer 45.

The liquid supply mechanism 10 supplies the prescribed liquid LQ on the image plane side of the projection optical system PL, and has: a liquid supply part 11 capable of feeding the liquid LQ; and supply pipes 13 (13A, 13B), each whose one end part is connected to the liquid supply part 11. The liquid supply part 11 is provided with a tank that stores the liquid LQ, a pressure pump, and the like. The control apparatus CONT is connected to the liquid supply part 11, and the control apparatus CONT controls the liquid supply operation of the liquid supply part 11. The liquid supply mechanism 10 supplies the liquid LQ onto the substrate P when forming the immersion area AR2 on the substrate P.

The liquid collection mechanism 20 collects the liquid LQ on the image plane side of the projection optical system PL, and has a liquid collection part 21 capable of collecting the liquid LQ, and collection pipes 23 (23A, 23B), whose one end part is connected to the liquid collection part 21. The liquid collection part 21 is provided with a vacuum system (a suction apparatus), e.g., a vacuum pump, and the like; a gas-liquid separator that separates the collected liquid LQ and gas, a tank that stores the collected liquid LQ; and the like. Furthermore, the vacuum system of the plant where the exposure apparatus EX is disposed may be used as the vacuum system, without providing the exposure apparatus EX with a vacuum pump. The control apparatus CONT is connected to the liquid collection part 21, and the control apparatus CONT controls the liquid collection operation of the liquid collection part 21. To form the immersion area AR2 on the substrate P, the liquid collection mechanism 20 collects a prescribed quantity of the liquid LQ on the substrate P that was supplied by the liquid supply mechanism 10.

A nozzle member 70 is disposed in the vicinity of the optical element 2, among the plurality of optical elements that constitutes the projection optical system PL, that contacts the liquid LQ. The nozzle member 70 is supported by the vibration isolating mechanism 60 and is vibrationally isolated from the lower side step part 7 of the main column 1. The nozzle member 70 is an annular member provided above the substrate P (and above the substrate stage PST) so that it surrounds the side surface of the optical element 2, and constitutes a part of the liquid supply mechanism 10 and the liquid collection mechanism 20, respectively.

Furthermore, the nozzle member 70 is made of, for example, aluminum, titanium, stainless steel, duralumin, or an alloy containing such. Alternatively, the nozzle member 70 may include a transparent member (an optical member) having light transmitting properties, such as glass (quartz).

Figure 2:
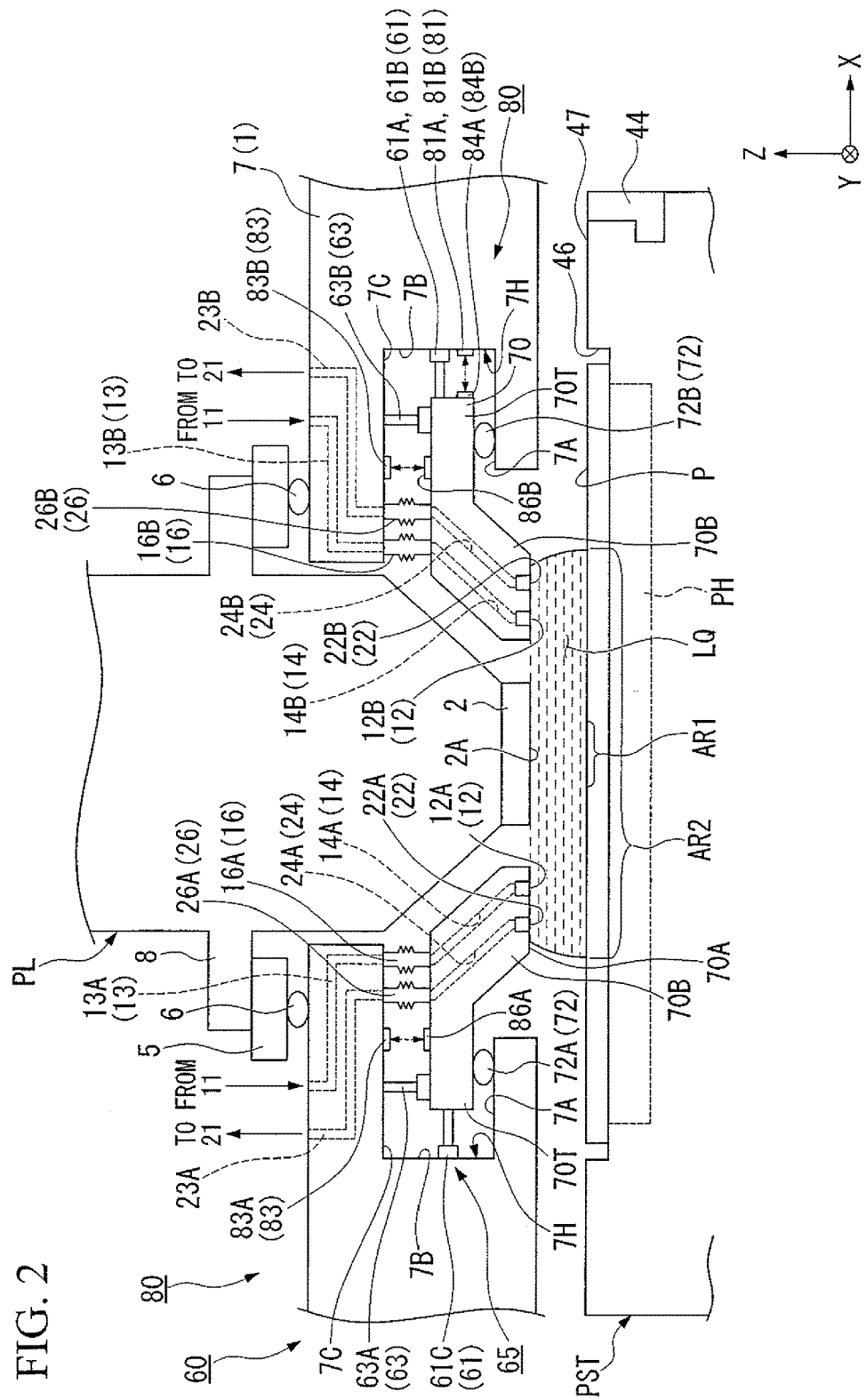
FIG. 2 is a side view that depicts the vicinity of a nozzle member.
Figure 3:
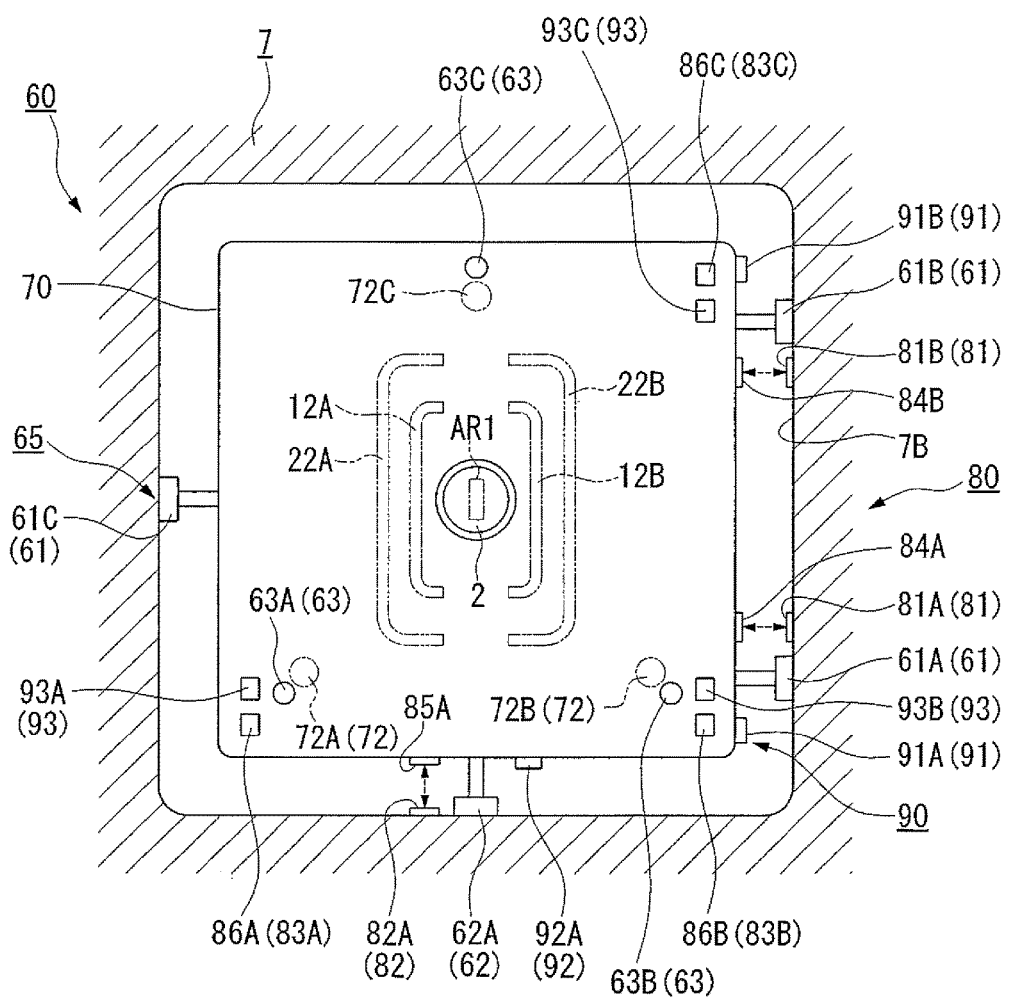
FIG. 3 is a plan view that depicts the nozzle member.

The following explains the nozzle member 70, referencing FIG. 2 and FIG. 3. FIG. 2 is an enlarged side view of the vicinity of the nozzle member 70, and FIG. 3 is a plan view that views the nozzle member 70 from above.

The nozzle member 70 is provided above the substrate P (the substrate stage PST), and includes liquid supply ports (liquid supply outlets) 12 (12A, 12B) disposed so that they oppose the surface of the substrate P. In the present embodiment, the nozzle member 70 has two liquid supply ports 12A, 12B. The liquid supply ports 12A, 12B are provided at a lower surface 70A of the nozzle member 70.

In addition, the interior of the nozzle member 70 has supply passageways 14 (14A, 14B) corresponding to the liquid supply ports 12 (12A, 12B). A plurality (two) of supply pipes 13 (13A, 13B) is provided so that it corresponds to the liquid supply ports 12A, 12B and the supply passageways 14A, 14B.

Furthermore, the nozzle member 70 is provided above the substrate P (the substrate stage PST), and has liquid collection ports (liquid collection inlets) 22 (22A, 22B) disposed so that they oppose the surface of the substrate P. In the present embodiment, the nozzle member 70 has two liquid collection ports 22A, 22B. The liquid collection ports 22A, 22B are provided at the lower surface 70A of the nozzle member 70.

In addition, the interior of the nozzle member 70 has collection passageways 24 (24A, 24B) corresponding to the liquid collection ports 22A, 22B. A plurality (two) of the collection pipes 23 (23A, 23B) is provided so that it corresponds to the liquid collection ports 22A, 22B and the collection passageways 24A, 24B.

The other end parts of the supply pipes 13A, 13B are connected to each one end part of tube members 16 (16A, 16B), which are expandable and contractible, and flexible. [Each] one end part of the supply passageways 14A, 14B are connected to the other end parts of the tube members 16A, 16B, and the other end parts of the supply passageways 14A, 14B are connected to the liquid supply ports 12A, 12B.

In addition, the other end parts of the collection pipes 23A, 23B are connected to each one end part of tube members 26 (26A, 26B), which are expandable and contractible, and flexible. The one end parts of the collection passageways 24A, 24B are connected to the other end parts of the tube members 26A, 26B, and other end parts of the collection passageways 24A, 24B are connected to the liquid collection ports 22A, 22B.

The liquid supply ports 12A, 12B that constitute the liquid supply mechanism 10 are provided sandwiching the projection area AR1 of the projection optical system PL at a position respectively on both sides in the X axial direction, and the liquid collection ports 22A, 22B that constitute the liquid collection mechanism 20 are provided on the outer sides of the liquid supply ports 12A, 12B of the liquid supply mechanism 10 with respect to the projection area AR1 of the projection optical system PL. As depicted in FIG. 3, the projection area AR1 of the projection optical system PL in the present embodiment is set to a rectangular shape in a plan view, with the Y axial direction as the longitudinal direction, and the X axial direction as the latitudinal direction. For each of the liquid supply ports 12A, 12B, the Y axial direction is the longitudinal direction, and both end parts thereof are slit shaped and bent inwardly.

For each of the liquid collection ports 22A, 22B, the Y axial direction is the longitudinal direction, and both end parts thereof are slit shaped and bent inwardly, and are provided so that they surround the liquid supply ports 12A, 12B and the projection area AR1.

The lower surface (liquid contact surface) 70A of the nozzle member 70 is lyophilic (hydrophilic), the same as the liquid contact surface 2A of the optical element 2. In addition, the lower surface 70A of the nozzle member 70 is substantially a flat surface, the lower surface 2A of the optical element 2 is also a flat surface, and the lower surface 70A of the nozzle member 70 is substantially flush with the lower surface 2A of the optical element 2. Thereby, the immersion area AR2 can be satisfactorily formed over a large area.

The nozzle member 70 has a main body part 70B in which the supply passageways 14 and the collection passageways 24 are formed, and a flange part 70T on the outer side of the main body part 70B. In addition, at the lower side step part 7 of the main column 1 is formed a recessed part 7H facing inwardly and capable of disposing the flange part 70T of the nozzle member 70.

The vibration isolating mechanism 60 supports the nozzle member 70 vibrationally isolated from the lower side step part 7 of the main column 1, and has: an active vibration isolating mechanism 65 that includes a plurality of nozzle drive apparatuses 61 (61A-61C), 62 (62A), 63 (63A-63C) that couples the recessed part 7H of the lower side step part 7 and the flange part 70T of the nozzle member 70, and that dynamically vibrationally isolates the nozzle member 70 from the lower side step part 7 of the main column 1; and passive vibration isolating mechanisms 72 (72A-72C) that support the flange part 70T of the nozzle member 70 and passively vibrationally isolate it from a bottom surface 7A of the recessed part 7H of the lower side step part 7.

The nozzle drive apparatuses 61-63 include, for example, voice coil motors or linear motors driven by Lorentz's force. A voice coil motor driven by Lorentz's force has a coil part and a magnet part, and the coil part and the magnet part are driven in a noncontact state. Consequently, it is possible to suppress the generation of vibrations by constituting the nozzle drive apparatuses 61-63 with drive apparatuses driven by Lorentz's force, such as voice coil motors.

In addition, the passive vibration isolating mechanisms 72 have, for example, air springs (air cylinders, air bellows), and the like, and the elastic effect of the gas (air) supports and vibrationally isolates the nozzle member 70. In the present embodiment, a plurality (three) of passive vibration isolating mechanisms 72 (72A-72C) is provided so that it surrounds the projection optical system PL, as depicted in FIG. 3.

In addition, the vibration isolating mechanism 60 supports the nozzle member 70 in a state separated from the projection optical system PL (the optical element 2). By supporting the nozzle member 70 and the projection optical system PL (the optical element 2) in a separated state, the vibrations generated by the nozzle member 70 are not directly transmitted to the projection optical system PL.

In addition, the liquid supply mechanism 10 and the liquid collection mechanism 20 are supported by a prescribed support mechanism isolated from the lens barrel base plate 5. Thereby, vibrations generated by the liquid supply mechanism 10 and the liquid collection mechanism 20 are not transmitted to the projection optical system PL via the lens barrel base plate 5.

The active vibration isolating mechanism 65 has: the X drive apparatuses 61 (61A-61C) that couple an inner side surface 7B on the X side of the recessed part 7H of the lower side step part 7 and the side surface on the X side of the nozzle member 70, and that drive the nozzle member 70 in the X axial direction with respect to the inner side surface 7B (the lower side step part 7); the Y drive apparatus 62 (62A) that couples the inner side surface 7B on the Y side of the recessed part 7H of the lower side step part 7 and the side surface on the Y side of the nozzle member 70, and that drives the nozzle member 70 in the Y axial direction with respect to the inner side surface 7B (the lower side step part 7); and the Z drive apparatuses 63 (63A-63C) that couple a ceiling surface 7C of the recessed part 7H of the lower side step part 7 and the upper surface of the nozzle member 70, and that drive the nozzle member 70 in the Z axial direction with respect to the ceiling surface 7C (the lower side step part 7).

Each of the drive apparatuses 61-63 is connected to the control apparatus CONT, and the control apparatus CONT controls the drive of each of the drive apparatuses 61-63.

In the present embodiment, the vibration isolating mechanism 60 has a plurality (three) of X drive apparatuses 61. Specifically, the vibration isolating mechanism 60 has two X drive apparatuses 61A, 61B provided arrayed in the Y axial direction on the +X side of the nozzle member 70, and an X drive apparatus 61C provided on the −X side of the nozzle member 70. The control apparatus CONT can move (translate) the nozzle member 70 in the X axial direction by driving the plurality of X drive apparatuses 61A-61C with the same drive quantity.

In addition, the nozzle member 70 can move (rotate) in the θZ direction by driving the plurality of X drive apparatuses 61A-61C using mutually differing drive quantities.

In addition, in the present embodiment, the vibration isolating mechanism 60 has one Y drive apparatus 62. Specifically, the vibration isolating mechanism 60 has the Y drive apparatus 62A provided on the −Y side of the nozzle member 70. The control apparatus CONT can move (translate) the nozzle member 70 in the Y axial direction by driving the Y drive apparatus 62A.

In addition, in the present embodiment, the vibration isolating mechanism 60 has a plurality (three) of Z drive apparatuses 63. Specifically, the vibration isolating mechanism 60 comprises three Z drive apparatuses 63A, 63B, 63C provided on the +Z side of the nozzle member 70 and provided so that they surround the projection optical system PL. The control apparatus CONT can move (translate) the nozzle member 70 in the Z axial direction by driving the plurality of Z drive apparatuses 63A-63C using the same drive quantity. In addition, the nozzle member 70 can be moved (rotated) in the θX direction and the θY direction by driving the plurality of Z drive apparatuses 63A-63C using mutually differing drive quantities.

Thus, the vibration isolating mechanism 60 can drive the nozzle member 70 by the plurality of drive apparatuses 61-63 in the directions (X axis, Y axis, Z axis, θX, θY and θZ directions) of the six degrees of freedom.

Furthermore, in the present embodiment, the same number of passive vibration isolating mechanisms 72 (72A-72C) and Z drive apparatuses 63 (63A-63C) are provided. In addition, as depicted in FIG. 3, the passive vibration isolating mechanisms 72A-72C and the Z drive apparatuses 63A-63C are respectively disposed mutually adjacent.

Furthermore, the count and placement of the X drive apparatuses 61, the Y drive apparatus 62, and the Z drive apparatuses 63 are arbitrarily settable. For example, the Z drive apparatuses 63 may be provided so that the lower surface of the flange part 70T of the nozzle member 70 and the bottom surface 7A of a recessed part 7H of the lower side step part 7 are coupled. Alternatively, one X drive apparatus 61 and two Y drive apparatuses 62 may be provided. In other words, the nozzle member 70 may be constituted using a plurality of drive apparatuses 61-63 so that the nozzle member 70 can be driven in the directions of the six degrees of freedom.

In addition, the working points of the passive vibration isolating mechanisms 72 (72A-72C) on the nozzle member 70 and the working points of the Z drive apparatuses 63 (63A-63C) on the nozzle member 70 are respectively coincident in the XY plain, but the corresponding working points may be set so that they are positioned on the same line (axis).

In addition, the exposure apparatus EX has a temperature regulating system (a cooling system), which is not shown, that adjusts (cools) the temperature of the drive apparatuses 61-63. Because the drive apparatuses 61-63 constitute heat generating sources, cooling by using the cooling system enables the suppression of fluctuations in the environment (the temperature) in which the exposure apparatus EX is placed. Furthermore, the cooling system may cool by using the liquid LQ for the immersion exposure, and may also cool by using a prescribed cooling liquid (refrigerant) separate from the liquid LQ for the immersion exposure.

In addition, the exposure apparatus EX has a nozzle position measuring instrument 80 that measures the positional relationship between the lower side step part 7 of the main column 1 and the nozzle member 70. In the present embodiment, the nozzle position measuring instrument 80 has laser interferometers. The nozzle position measuring instrument 80 has X interferometers 81 (81A, 81B) that measure the distance (the relative position) between the inner side surface 7B on the X side of the recessed part 7H of the lower side step part 7 and the side surface on the X side of the nozzle member 70; a Y interferometer 82 (82A) that measures the distance (the relative position) between the inner side surface 7B on the Y side of the recessed part 7H of the lower side step part 7 and the side surface on the Y side of the nozzle member 70; and Z interferometers 83 (83A-83C) that measure the distance (the relative position) between the ceiling surface 7C of the recessed part 7H of the lower side step part 7 and the upper surface of the nozzle member 70. Each of the interferometers 81-83 is connected to the control apparatus CONT, and the measurement result of each of the interferometers 81-83 is outputted to the control apparatus CONT.

In the present embodiment, the nozzle position measuring instrument 80 has a plurality (two) of X interferometers 81. Specifically, the nozzle position measuring instrument 80 has two X interferometers 81A, 81B provided arrayed in the Y axial direction on the inner side surface 7B on the +X side of the recessed part 7H of the lower side step part 7. In addition, reflecting surfaces 84A, 84B are provided at a position respectively opposing the X interferometers 81A, 81B on the side surface on the +X side of the nozzle member 70. Based on at least any one of the measurement results of the X interferometers 81A, 81B, the control apparatus CONT can derive the position of the nozzle member 70 in the X axial direction with respect to the lower side step part 7. In addition, based on the respective measurement results of the plurality of X interferometers 81A, 81B, the control apparatus CONT can derive the position of the nozzle member 70 in the θZ direction with respect to the lower side step part 7.

In addition, in the present embodiment, the nozzle position measuring instrument 80 has one Y interferometer 82. Specifically, the nozzle position measuring instrument 80 has the Y interferometer 82A provided on the inner side surface 7B on the −Y side of the recessed part 7H of the lower side step part 7. In addition, a reflecting surface 85A is provided at a position opposing the Y interferometer 82A on the side surface on the −Y side of the nozzle member 70. Based on the measurement result of the Y interferometer 82A, the control apparatus CONT can derive the position of the nozzle member 70 in the Y axial direction with respect to the lower side step part 7.

In addition, in the present embodiment, the nozzle position measuring instrument 80 has a plurality (three) of Z interferometers 83. Specifically, the nozzle position measuring instrument 80 has Z interferometers 83A, 83B provided arrayed in the X axial direction on the ceiling surface 7C of the recessed part 7H of the lower side step part 7, and a Z interferometer 83C provided at a position aligned in the Y axial direction with respect to the Z interferometer 83B. In addition, reflecting surfaces 86A, 86B, 86C are provided at positions respectively opposing the Z interferometers 83A, 83B, 83C on the upper surface of the nozzle member 70. Based on at least any one measurement result of the Z interferometers 83A, 83B, 83C, the control apparatus CONT can derive the position of the nozzle member 70 in the Z axial direction with respect to the lower side step part 7. In addition, based on at least any two measurement results of the plurality of Z interferometers 83A, 83B, 83C, the control apparatus CONT can derive the position of the nozzle member 70 in the θX direction and the θY direction with respect to the lower side step part 7.

Thus, based on the measurement results of the plurality of interferometers 81-83, the control apparatus CONT can derive the position of the nozzle member 70 with respect to the lower side step part 7 (the main column 1) in the directions (X axis, Y axis, Z axis, θX, θY and θZ directions) of the six degrees of freedom.

The count and placement of the X interferometers 81, the Y interferometer 82, and the Z interferometers 83 can be arbitrarily set. For example, the Z interferometers 83 may be provided so that they measure the distance (the relative position) between the lower surface of the flange part 70T of the nozzle member 70 and the bottom surface 7A of the recessed part 7H of the lower side step part 7. Alternatively, one X interferometer 81 and two Y interferometers 82 may be provided. In other words, it may be constituted so that the position of the nozzle member 70 in the directions of the six degrees of freedom can be measured using the plurality of interferometers 81-83.

Furthermore, the nozzle position measuring instrument 80 is not limited to interferometers, and it is also possible to use position measuring instruments having another constitution, e.g., capacitance sensors, encoders, and the like.

In addition, the exposure apparatus EX has an accelerometer 90 that measures the acceleration information of the nozzle member 70. In the present embodiment, the accelerometer 90 has X accelerometers 91 (91A, 91B) that measure the acceleration of the nozzle member 70 in the X axial direction, a Y accelerometer 92 (92A) that measures the acceleration of the nozzle member 70 in the Y axial direction, and Z accelerometers 93 (93A-93C) that measure the acceleration of the nozzle member 70 in the Z axial direction.

Each of the accelerometers 91-93 is connected to the control apparatus CONT, and the measurement result of each of the accelerometers 91-93 is output to the control apparatus CONT.

In the present embodiment, the accelerometer 90 has a plurality (two) of X accelerometers 91. Specifically, the accelerometer 90 has two X accelerometers 91A, 91B provided arrayed in the Y axial direction on the side surface on the +X side of the nozzle member 70. Based on at least any one measurement result of the X accelerometers 91A, 91B, the control apparatus CONT can derive the acceleration of the nozzle member 70 in the X axial direction. In addition, based on the measurement results of each of the plurality of X accelerometers 91A, 91B, the control apparatus CONT can derive the acceleration of the nozzle member 70 in the θZ direction.

In addition, in the present embodiment, the accelerometer 90 has one Y accelerometer 92. Specifically, the accelerometer 90 has a Y accelerometer 92A provided on the side surface on the −Y side of the nozzle member 70. Based on the measurement result of the Y accelerometer 92A, the control apparatus CONT can derive the acceleration of the nozzle member 70 in the Y axial direction.

In addition, in the present embodiment, the accelerometer 90 has a plurality (three) of Z accelerometers 93. Specifically, the accelerometer 90 has Z accelerometers 93A, 93B provided arrayed in the X axial direction on the upper surface of the nozzle member 70, and a Z accelerometer 93C provided at a position lined up with the Z accelerometer 93B in the Y axial direction. Based on at least any one measurement result of the Z accelerometers 93A, 93B, 93C, the control apparatus CONT can derive the acceleration of the nozzle member 70 in the Z axial direction. In addition, based on at least any two measurement results of the plurality of Z accelerometers 93A, 93B, 93C, the control apparatus CONT can derive the acceleration of the nozzle member 70 in the θX direction and the θY direction.

Thus, based on the measurement results of the plurality of accelerometers 91-93, the control apparatus CONT can derive the acceleration of the nozzle member 70 in the directions (X axis, Y axis, Z axis, θX, θY and θZ directions) of the six degrees of freedom.

In addition, the count and placement of the X accelerometers 91, the Y accelerometer 92, and the Z accelerometers 93 can be arbitrarily set. For example, the Z accelerometers 93 can be provided at the lower surface of the flange part 70T of the nozzle member 70. Alternatively, one X accelerometer 91 and two Y accelerometers 92 may be provided. In other words, it may be constituted so that the acceleration of the nozzle member 70 can be measured in the directions of the six degrees of freedom using the plurality of accelerometers 91-93.

The following explains a method of exposing the pattern image of the mask M onto the substrate P using the exposure apparatus EX having a constitution as discussed above.

The control apparatus CONT projects and exposes the pattern image of the mask M onto the substrate P via the projection optical system PL and the liquid LQ between the projection optical system PL and the substrate P while moving the substrate stage PST that supports the substrate P in the X axial direction (the scanning direction) as the liquid supply mechanism 10 supplies the liquid LQ onto the substrate P and, in parallel, the liquid collection mechanism 20 collects the liquid LQ on the substrate P.

After the liquid LQ supplied from the liquid supply part 11 of the liquid supply mechanism 10 to form the immersion area AR2 is distributed through the supply pipes 13A, 13B and the tube members 16A, 16B, it is supplied onto the substrate P by the liquid supply ports 12A, 12B via the supply passageways 14A, 14B formed inside the nozzle member 70. The liquid LQ supplied onto the substrate P from the liquid supply ports 12A, 12B is supplied so that it wetly spreads between the substrate P and the lower end surface of the tip part (the optical element 2) of the projection optical system PL, and locally forms the immersion area AR2, which is smaller than the substrate P and larger than the projection area AR1, on a part of the substrate P that includes the projection area AR1. At this time, the control apparatus CONT simultaneously supplies the liquid LQ onto the substrate P from both sides of the projection area AR1 in the scanning direction respectively by the liquid supply ports 12A, 12B of the liquid supply mechanism 10 disposed on both sides in the X axial direction (the scanning direction) of the projection area AR1. Thereby, the immersion area AR2 is uniformly and satisfactorily formed.

In addition, after the liquid LQ on the substrate P is collected by the liquid collection ports 22A, 22B of the nozzle member 70, it is collected in the liquid collection part 21 via the collection passageways 24A, 24B, the tube members 26A, 26B, and the collection pipes 23A, 23B. At this time, the control apparatus CONT can control the amount of liquid collected per unit of time by the liquid collection part 21, and just a prescribed quantity of liquid LQ on the substrate P is collected per unit of time.

The exposure apparatus EX in the present embodiment projects and exposes on the substrate P the pattern image of the mask M while moving the mask M and the substrate P in the X axial direction (the scanning direction); during scanning exposure, the pattern image of one part of the mask M is projected inside the projection area AR1 via the projection optical system PL and the liquid LQ of the immersion area AR2, and, synchronized to the movement of the mask M at a speed V in the −X direction (or the +X direction), the substrate P moves at a speed β (V (where (is the projection magnification) in the +X direction (or the −X direction) with respect to the projection area AR1. A plurality of shot regions are set on the substrate P; after the exposure of one shot region is completed, the next shot region moves to the scanning start position by the stepping movement of the substrate P, and the scanning exposure process is subsequently performed sequentially for each shot region while moving the substrate P by the step-and-scan system.

Vibrations may be produced by the nozzle member 70 due to the supply and collection of the liquid LQ. In addition, the vibration component produced by the substrate P side due to the movement of the substrate stage PST in the XY direction to perform scanning and exposure, and due the movement in the Z axial direction and the inclined directions (θX, θY directions) to perform focus leveling adjustment, may be transmitted to the nozzle member 70 via the liquid LQ of the immersion area AR2. In addition, it is also conceivable that the viscous resistance of the liquid LQ in the immersion area AR2 may move the nozzle member 70 when scanning the substrate P. In other words, there is also a possibility that the liquid LQ of the immersion area AR2 may exert a force on the nozzle member 70.

Because the lower side step part 7 (the main column 1) that supports the nozzle member 70 also supports the projection optical system PL, there is a possibility that vibrations produced by the nozzle member 70 will be transmitted to the projection optical system PL. If vibrations produced by the nozzle member 70 are transmitted to the projection optical system PL, then the pattern image projected onto the substrate P, via the projection optical system PL and the liquid LQ, will degrade. Therefore, the control apparatus CONT uses the vibration isolating mechanism 60 to vibrationally isolate the vibrations of the nozzle member 70 so that they do not transmit to the projection optical system PL.

When the nozzle member 70 vibrates, the position of the nozzle member 70 with respect to the lower side step part 7 of the main column 1 fluctuates, and the control apparatus CONT therefore drives the drive apparatuses 61-63 of the vibration isolating mechanism 60 based on the measurement results of the nozzle position measuring instrument 80. The nozzle position measuring instrument 80 measures the position of the nozzle member 70 with respect to the lower side step part 7. Based on the measurement result of the nozzle position measuring instrument 80, the control apparatus CONT drives the drive apparatuses 61-63 of the vibration isolating mechanism 60 so that the position of the nozzle member 70 with respect to the lower side step part 7 is maintained in a desired state, i.e., so that the positional relationship between the lower side step part 7 and the nozzle member 70 is fixedly maintained.

At this time, the control apparatus CONT performs arithmetic processing based on the measurement result of each of the X, Y, Z position measuring instruments 81, 82, 83, and derives each position information of the nozzle member 70 with respect to the lower side step part 7 in the directions (X axis, Y axis, Z axis, θX, θY and θZ directions) of the six degrees of freedom. Based on the position information derived above for the directions of the six degrees of freedom, the control apparatus CONT controls each position of the nozzle member 70 with respect to the lower side step part 7 in the directions (X axis, Y axis, Z axis, θX, θY and θZ directions) of the six degrees of freedom by driving each of the X, Y, Z drive apparatuses 61, 62, 63.

In addition, because the nozzle member 70 is supported by the passive vibration isolating mechanisms 72, including air springs, the elastic effect of the gas of those air springs can reduce the high frequency component of the vibrations attempting to transmit from the nozzle member 70 side to the lower side step part 7. Furthermore, the active vibration isolating mechanism 65, which includes the drive apparatuses 61-63, reduces the comparatively low frequency component (e.g., 1-10 Hz) of the vibrations, and the vibration isolating mechanism 60 can therefore obtain the effect of eliminating vibrations in a broad frequency band. Thus, by combining active vibration isolation (dynamic vibration isolation) using the drive apparatuses 61-63 with passive vibration isolation (passive vibration isolation) using the elastic action of gas, it is possible to effectively suppress the transmission of the vibrations acting on the nozzle member 70 to the projection optical system PL via the lower side step part 7. In addition, because it is conceivable that the extremely low frequency component (e.g., the frequency component below 1 Hz) of the vibration components of the nozzle member 70 will have little impact on the accuracy of transferring the pattern onto the substrate P, a control system for the vibration isolating mechanism 60 can be constructed so that it does not control the isolation of vibrations for that frequency component. Doing so prevents disadvantages, such as the oscillation of the control system, and makes it possible to construct the control system with a comparatively simple constitution.

As explained above, the vibration isolating mechanism 60 can prevent the transmission of vibrations produced by the nozzle member 70 to the projection optical system PL via the lower side step part 7 (the main column 1). Accordingly, it is possible to prevent degradation of the pattern image projected onto the substrate P via the projection optical system PL and the liquid LQ.

In addition, the vibration isolating mechanism 60 supports the nozzle member 70 in a state separated from the projection optical system PL (the optical element 2). By supporting the nozzle member 70 and the projection optical system PL (the optical element 2) in a separated state, vibrations generated by the nozzle member 70 are not directly transmitted to the projection optical system PL.

In addition, a prescribed support mechanism supports the liquid supply mechanism 10 and the liquid collection mechanism 20 isolated from the lens barrel base plate 5. Thereby, vibrations generated by the liquid supply mechanism 10 and the liquid collection mechanism 20 are not transmitted to the projection optical system PL via the lens barrel base plate 5.

In addition, in the present embodiment, the supply pipes 13A, 13B and the supply passageways 14A, 14B of the nozzle member 70 are connected via the tube members 16A, 16B, which are expandable and contractible, and flexible. Likewise, the collection pipes 23A, 23B and the collection passageways 24A, 24B of the nozzle member are connected via the tube members 26A, 26B, which are expandable and contractible, and flexible. Consequently, they do not interfere with the drive of the nozzle member 70 even when the nozzle member 70 is driven using the drive apparatuses 61-63. Accordingly, the vibration isolating mechanism 60 can satisfactorily support the nozzle member 70 and vibrationally isolate it from the lower side step part 7.

In addition, a constitution is conceivable in which a reference mirror (a fixed mirror) of a interferometer system for measuring the position information of the substrate stage PST is affixed to the lens barrel PK of the projection optical system PL; however, the measurement of the position information of the substrate stage PST and the control of the position based on the measurement result thereof can be performed with good accuracy, even if the reference mirror (the fixed mirror) of the interferometer system for measuring the position information of the substrate stage PST is affixed to the lens barrel PK so that vibrations are not transmitted to the projection optical system PL.

In addition, as discussed above, there is a possibility that the liquid LQ of the immersion area AR2 will exert a force on the nozzle member 70, and there is also a possibility that that force will fluctuate the position of the nozzle member 70 and that the liquid LQ will unfortunately be supplied and collected in a state wherein the nozzle member 70 is not disposed at the optimal position with respect to the projection area AR1 or the immersion area AR2 of the substrate P. In that case, the control apparatus CONT can supply and collect the liquid LQ for forming the immersion area AR2 in a state wherein the nozzle member 70 is disposed at the optimal position by using the drive apparatuses 61-63 of the vibration isolating mechanism 60 to adjust the positional relationship between the lower side step part 7 (the main column 1) and the nozzle member 70. Accordingly, the immersion area AR2 can be satisfactorily formed and immersion exposure can be performed with good accuracy.

In addition, the control apparatus CONT can adjust the position of the nozzle member 70 using the drive apparatuses 61-63. Consequently, to collect the liquid LQ on the substrate P (on the substrate stage PST), for example, after the completion of the immersion exposure of the substrate P, it is also possible to collect the liquid in a state in which the nozzle member 70 moves in the −Z direction (the downward direction), and the liquid collection ports 22 of the nozzle member 70 approach the substrate P.

Alternatively, it is also possible to use the drive apparatuses 61-63 to adjust the positional relationship between the substrate P and the nozzle member 70, including the distance between the surface of the substrate P and the lower surface 70A of the nozzle member 70, in response to the immersion scanning conditions (the scanning speed of the substrate P, the physical property (viscosity) of the liquid LQ, and the like), and then perform immersion exposure. In addition, contact between the nozzle member 70 and the substrate P, or between the nozzle member 70 and the substrate stage PST, may also be prevented by, when the nozzle member 70 is not being used, moving the nozzle member 70 in advance in the +Z direction (upward direction).

Furthermore, in the present embodiment discussed above, the control apparatus CONT drives the drive apparatuses 61-63 based on the measurement result from the nozzle position measuring instrument 80 so that the vibrations of the nozzle member 70 are not transmitted to the projection optical system PL via the lower side step part 7; however, the control apparatus CONT may also drive the drive apparatuses 61-63 based on the measurement result of the accelerometer 90. At this time, the control apparatus CONT performs arithmetic processing based on the measurement result of each of the X, Y, Z accelerometers 91, 92, 93, and derives acceleration information of the nozzle member 70 in the directions (X axis, Y axis, Z axis, θX, θY and θZ directions) of the six degrees of freedom. The control apparatus CONT suppresses the vibration components of the nozzle member 70 in the directions (X axis, Y axis, Z axis, θX, θY and θZ directions) of the six degrees of freedom by driving each of the X, Y, Z drive apparatuses 61, 62, 63 based on the acceleration information derived above in the directions of the six degrees of freedom.

In addition, the control apparatus CONT may also drive the drive apparatuses 61-63 taking into consideration both the measurement result of the nozzle position measuring instrument 80 and the measurement result of the accelerometer 90.

In addition, it is possible to constitute the vibration isolating mechanism 60 with just the passive vibration isolating mechanisms 72 without providing the active vibration isolating mechanism 65, and it is also possible to constitute it by just the active vibration isolating mechanism 65 without providing the passive vibration isolating mechanisms 72.

Furthermore, in the present embodiment discussed above, the nozzle member 70 has both the liquid supply ports 12 and the liquid collection ports 22, but a nozzle member (a supply nozzle) having the liquid supply ports 12 and a nozzle member (a collection nozzle) having the liquid collection ports 22 may be separately provided. In this case, the vibration isolating mechanism (adjustment mechanism) 60 may be provided with both the supply nozzle and the collection nozzle, or may be provided with any one thereof.

Furthermore, in the present embodiment discussed above, the positional control of the nozzle member 70 (the control of the active vibrational isolation from the lower side step part 7) is accomplished by feedback control based on the result of measuring the position of the nozzle member 70 by the position measuring instrument 80; however, in that case, there is the possibility of control delays. Therefore, it is also possible to perform active vibrational isolation by employing feedforward control, in which, physical quantities related to the behavior of the exposure apparatus EX and the liquid LQ during scanning exposure are derived prior to performing the exposure, and the attitude of the nozzle member 70 is controlled by driving the drive apparatuses 61-63 during exposure based on those derived physical quantities.

Furthermore, it is also possible to combine feedback control and feedforward control.

If performing feedforward control, then a test exposure is performed beforehand and a plurality of physical quantities is derived. Namely, an identification test is performed on the system of the exposure apparatus EX, and the dynamic characteristics, including the physical quantities of that system, are derived. In the identification test, the liquid LQ is supplied and collected by the liquid supply mechanism 10 and the liquid collection mechanism 20 via the liquid supply ports 12 and the liquid collection ports 22 of the nozzle member 70, the substrate stage PST is scanned in a state in which the immersion area AR2 is formed between the substrate P and the optical element 2, and between the substrate P and the nozzle member 70, and the physical quantities are detected using the nozzle position measuring instrument 80. Furthermore, the drive apparatuses 61-63 are, of course, not driven during the identification test. The physical quantities detected include: the time during the exposure sequence; the position, speed, and acceleration of the substrate P; the position, speed, and acceleration of the nozzle member 70; the relative position, the relative speed, and the relative acceleration between the nozzle member 70 and the substrate P; and the like. The position, speed, and acceleration values are detected for all X axis, Y axis, Z axis, θX, θY and θZ directions (six degrees of freedom). Furthermore, the physical quantities detected include the quantity (volume and mass) and physical quantities (viscosity and the like) of the liquid LQ supplied. The plurality of physical quantities detected by the identification test is stored in the control apparatus CONT. Based on the detected physical quantities, the control apparatus CONT determines the control quantities for driving the drive apparatuses 61-63, and performs the exposure while driving the drive apparatuses 61-63 based on those determined physical quantities so that the nozzle member 70 is vibrationally isolated from the lower side step part 7. Thus, the control apparatus CONT can use the drive apparatuses 61-63 to perform vibrational isolation in accordance with the dynamic characteristics (operation) of the exposure apparatus EX itself, and can maintain the positional relationship between the lower side step part 7 and the nozzle member 70 in the desired state.

The following explains another embodiment of the present invention. In the explanation below, constituent parts that are identical or equivalent to those in the embodiments discussed above are assigned the identical reference characters, and the explanation thereof is simplified or omitted.

Figure 4:
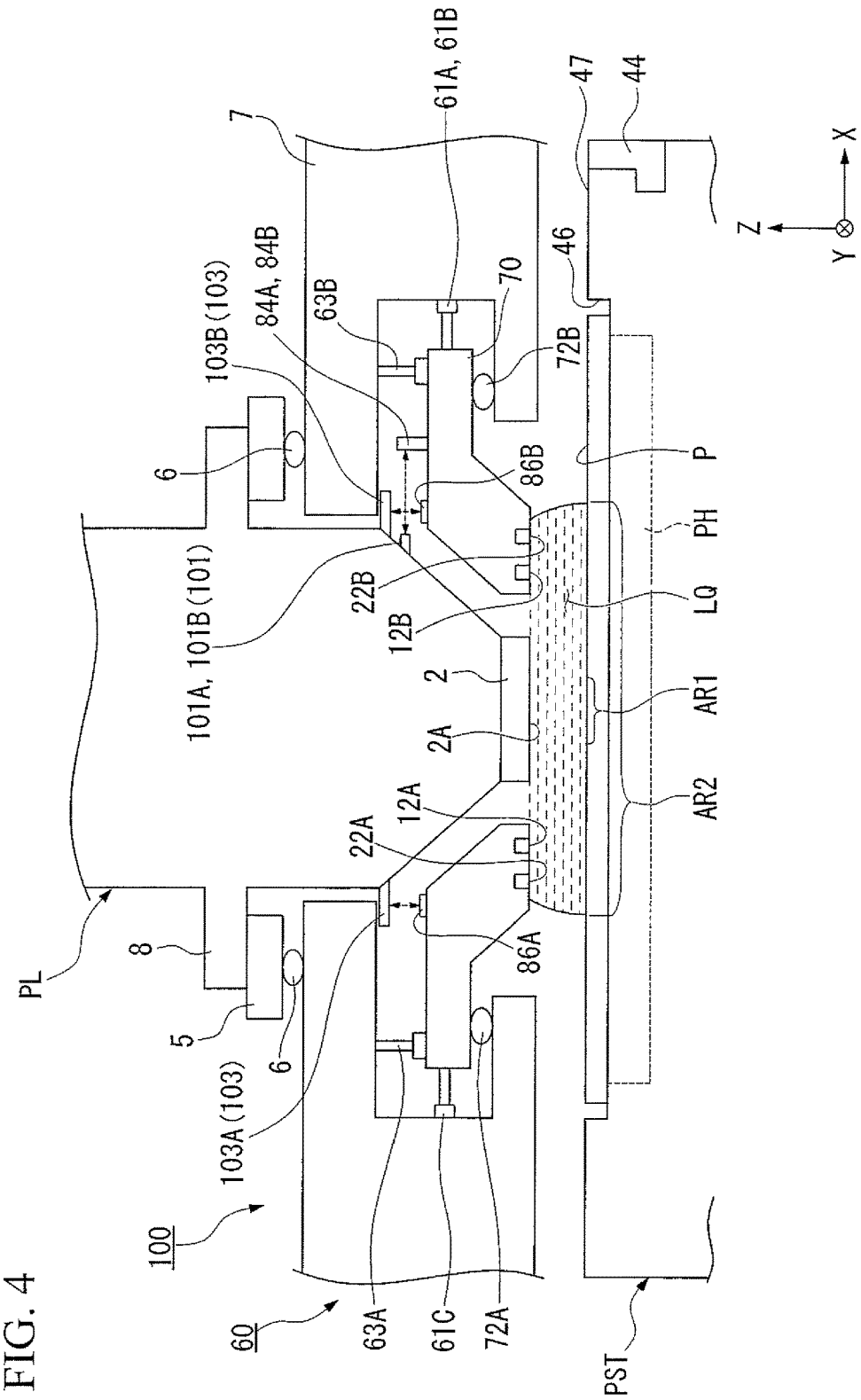
FIG. 4 is a side view that depicts another embodiment of the exposure apparatus of the present invention.

FIG. 4 depicts another embodiment of the present invention. In FIG. 4, the exposure apparatus EX has a nozzle position measuring instrument 100 that measures the positional relationship between the nozzle member 70 and the projection optical system PL supported by the lower side step part 7 of the main column 1. The nozzle position measuring instrument 100 has: X interferometers 101 (101A, 101B) that measure the positional relationship between the projection optical system PL and the nozzle member 70 in the X axial direction; a Y interferometer 102 (however, not depicted in FIG. 4) that measures the positional relationship between the projection optical system PL and the nozzle member 70 in the Y axial direction; and Z interferometers 103 (103A-103C) (however, 103C is not depicted in FIG. 4) that measure the positional relationship between the projection optical system PL and the nozzle member 70 in the Z axial direction. Each of the interferometers 101-103 are affixed to the lens barrel PK of the projection optical system PL. Each of the interferometers 101-103 are connected to the control apparatus CONT, and the measurement result from each of the interferometers 101-103 is outputted to the control apparatus CONT.

Based on the measurement result of the plurality of interferometers 101-113, the control apparatus CONT can derive the position of the nozzle member 70 with respect to the projection optical system PL (the lens barrel PK) in the directions (X axis, Y axis, Z axis, θX, θY and θZ directions) of the six degrees of freedom. The control apparatus CONT drives the drive apparatuses 61-63 based on the derived position information mentioned above so that the vibrations of the nozzle member 70 do not transmit to the projection optical system PL. Alternatively, the control apparatus CONT adjusts the positional relationship between the projection optical system PL and the nozzle member 70 by driving the drive apparatuses 61-63 based on the derived position information mentioned above.

Figure 5:
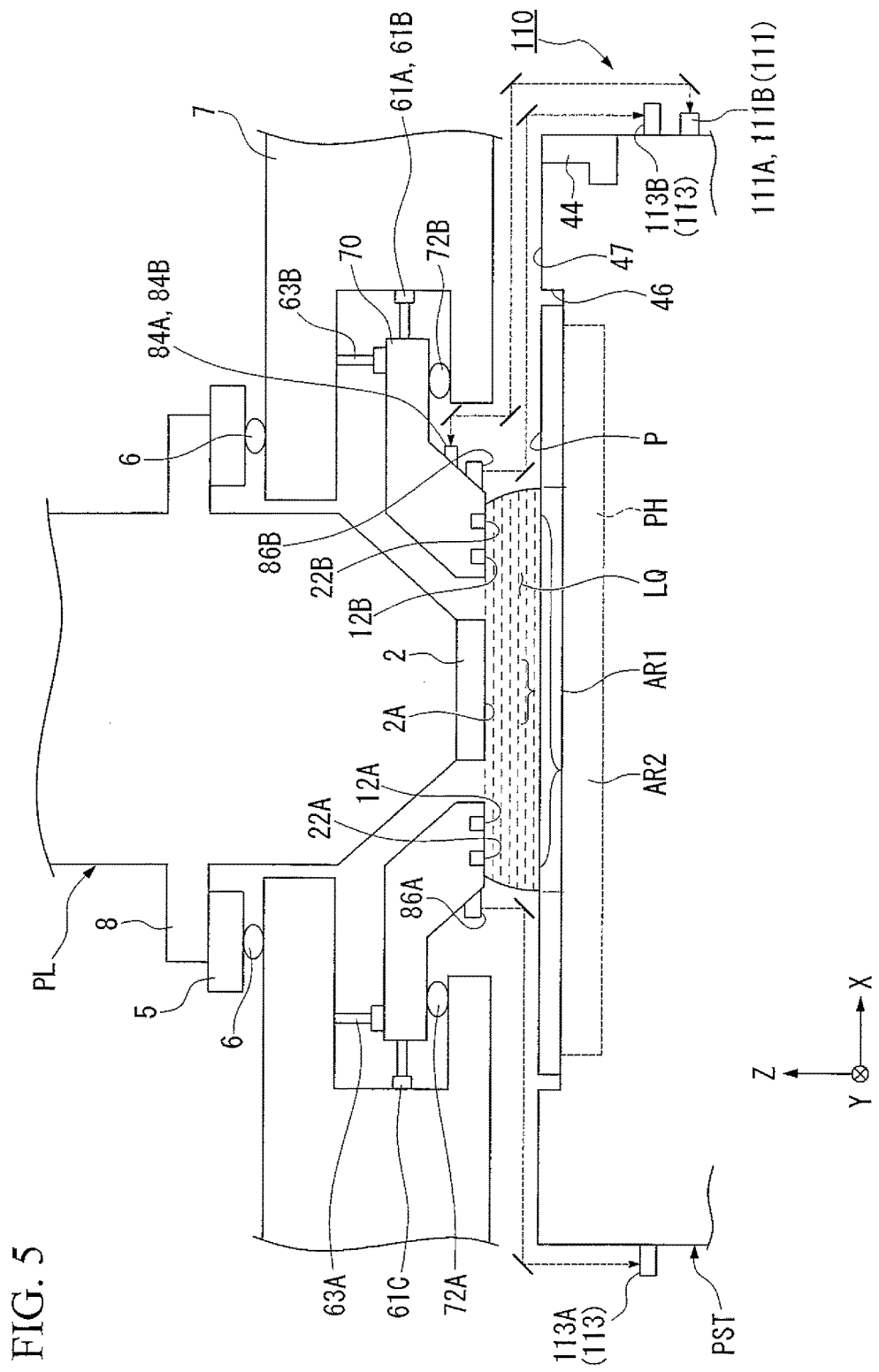
FIG. 5 is a side view that depicts another embodiment of the exposure apparatus of the present invention.

FIG. 5 depicts another embodiment of the present invention. In FIG. 5, the exposure apparatus EX has a nozzle position measuring instrument 110 that measures the positional relationship between the substrate stage PST and the nozzle member 70. The nozzle position measuring instrument 110 has: X interferometers 111 (111A, 111B) that measure the positional relationship between the substrate stage PST and the nozzle member 70 in the X axial direction; a Y interferometer 112 (however, not depicted in FIG. 5) that measures the positional relationship between the substrate stage PST and the nozzle member 70 in the Y axial direction; and Z interferometers 113 (113A-113C) (however, 113C is not depicted in FIG. 5) that measures the positional relationship between the substrate stage PST and the nozzle member 70 in the Z axial direction. Each of these interferometers 11-113 is affixed at a prescribed position to the substrate stage PST so that it does not interfere with the exposure process. In FIG. 5, each of the interferometers 111-113 is affixed to the side surface of the substrate stage PST. Each of the interferometers 111-113 is connected to the control apparatus CONT, and the measurement result of each of the interferometers 111-113 is outputted to the control apparatus CONT.

Based on the measurement results of the plurality of interferometers 111-113, the control apparatus CONT can derive the position of the nozzle member 70 with respect to the substrate stage PST in the directions (X axis, Y axis, Z axis, θX, θY and θZ directions) of the six degrees of freedom. The control apparatus CONT adjusts the positional relationship between the substrate stage PST and the nozzle member 70 by driving the drive apparatuses 61-63 based on the derived position information mentioned above.

As discussed above, the liquid LQ in the present embodiment comprises pure water. Pure water is advantageous because it can be easily obtained in large quantities at a semiconductor fabrication plant, and the like, and because pure water has no adverse impact on the optical element (lens), the photoresist on the substrate P, and the like. In addition, because pure water has no adverse impact on the environment and has an extremely low impurity content, it can also be expected to have the effect of cleaning the surface of the substrate P, and the surface of the optical element provided on the tip surface of the projection optical system PL. Furthermore, the exposure apparatus may be provided with an ultrapure water manufacturing apparatus if the purity of the pure water supplied from the plant, and the like, is low.

Further, the refractive index n of pure water (water) for the exposure light EL having a wavelength of approximately 193 nm is said to be substantially 1.44; therefore, the use of ArF excimer laser light (193 nm wavelength) as the light source of the exposure light EL would shorten the wavelength on the substrate P to 1/n, i.e., approximately 134 nm, thereby obtaining a high resolution. Furthermore, because the depth of focus will increase approximately n times, i.e., approximately 1.44 times, that of in air, the numerical aperture of the projection optical system PL can be further increased if it is preferable to ensure a depth of focus approximately the same as that when used in air, and the resolution is also improved from this standpoint.

Furthermore, the numerical aperture NA of the projection optical system may become 0.9-1.3 if the liquid immersion method as discussed above is used. If the numerical aperture NA of such a projection optical system increases, then random polarized light conventionally used as the exposure light will degrade imaging performance due to the polarization effect, and it is therefore preferable to use polarized illumination. In that case, it is better to illuminate with linearly polarized light aligned in the longitudinal direction of the line pattern of the line-and-space pattern of the mask (the reticle), and to emit a large amount of diffracted light of the S polarized light component (the TE polarized light component) i.e., the polarized light direction component aligned in the longitudinal direction of the line pattern, from the pattern of the mask (the reticle). If a liquid is filled between the projection optical system PL and the resist coated on the surface of the substrate P, then the transmittance through the resist surface increases for the diffracted light of the S polarized light component (the TE polarized light component), which contributes to the improvement of the contrast, compared with the case in which air (a gas) is filled between the projection optical system PL and the resist coated on the surface of the substrate P, and a high imaging performance can consequently be obtained even if the numerical aperture NA of the projection optical system exceeds 1.0. In addition, it is further effective to appropriately combine a phase shift mask and the oblique incidence illumination method (particularly the dipole illumination method) aligned in the longitudinal direction of the line pattern, as disclosed in Japanese Published Patent Application No. H06-188169. For example, in a case where a half tone phase shift mask (a pattern with an approximately 45 nm half pitch) having a transmittance of 6% is illuminated using the linear polarized light illumination method and the dipole illumination method in parallel, then the depth of focus (DOF) can be increased by approximately 150 nm more than when using random polarized light if the illumination a stipulated by the circumscribed circle of the dual beam that forms the dipole in the pupil plane of the illumination system is 0.95, the radius of each beam in that pupil plane is 0.125, and the numerical aperture NA of the projection optical system PL is 1.2.

In addition, if a fine line-and-space pattern (e.g., a line-and-space of approximately 25-50 nm) is exposed on the substrate P using, for example, an ArF excimer laser as the exposure light and using a projection optical system PL having a reduction magnification of approximately ¼, then the structure of the mask M (e.g., the fineness of the pattern and the thickness of the chrome) causes the mask M to act as a polarizing plate due to the wave guide effect, and a large amount of diffracted light of the S polarized light component (the TE polarized light component) from the diffracted light of the P polarized light component (the TM polarized light component), which decreases contrast, is emitted from the mask M. In this case, it is preferable to use the linear polarized light illumination discussed above; however, even if the mask M is illuminated with random polarized light, a high resolution performance can be obtained even if the numerical aperture NA of the projection optical system PL is as large as 0.9-1.3.

In addition, if exposing an ultrafine line-and-space pattern of a mask M onto a substrate P, then there is also a possibility that the P polarized light component (the TM polarized light component) will become greater than the S polarized light component (the TE polarized light component) due to the wire grid effect; however, because a greater quantity of diffracted light of the S polarized light component (the TE polarized light component) than the diffracted light of the P polarized light component (the TM polarized light component) is emitted from the mask M if a line-and-space pattern larger than 25 nm is exposed onto the substrate P using, for example, an ArF excimer laser as the exposure light and using a projection optical system PL having a reduction magnification of approximately ¼, then a high imaging performance can be obtained even if the numerical aperture NA of the projection optical system PL is as large as 0.9-1.3.

Furthermore, instead of just linear polarized light illumination (S polarized light illumination) aligned in the longitudinal direction of the line pattern of the mask (the reticle), it is also effective to combine the oblique incidence illumination method with the polarized light illumination method that linearly polarizes light in a direction tangential (circumferential) to a circle with the optical axis at the center, as disclosed in Japanese Published Patent Application No. H06-53120. In particular, if the mask (reticle) pattern mixes line patterns extending in a plurality of differing directions instead of a line pattern extending in a prescribed single direction, then by combining the use of the zonal illumination method with the polarized light illumination method that linearly polarizes light in a direction tangential to a circle having the optical axis at its center, as likewise disclosed in Japanese Published Patent Application No. H06-53120, it is possible to achieve high imaging performance even if the numerical aperture NA of the projection optical system is large. For example, if illuminating a half tone phase shift mask (pattern with an approximately 63 nm half pitch) having a transmittance of 6% by combining the use of the zonal illumination method (¾ zonal ratio) with the polarized light illumination method that linearly polarizes light in a direction tangential to a circle with the optical axis at its center, then the depth of focus (DOF) can be increased by approximately 250 nm more than when using random polarized light if the illumination a is 0.95 and the numerical aperture NA of the projection optical system PL is 1.00, and the depth of focus can be increased by approximately 100 nm if the numerical aperture NA of the projection optical system is 1.2 with a pattern having an approximately 55 nm half pitch.

In the present embodiment, the optical element 2 is affixed at the tip of the projection optical system PL, and the optical characteristics of the projection optical system PL, e.g., aberrations (spherical aberration, coma aberration, and the like) can be adjusted by this lens. Furthermore, the optical element affixed to the tip of the projection optical system PL may also be an optical plate used to adjust the optical characteristics of the projection optical system PL. Alternatively, it may be a plane parallel plate capable of transmitting the exposure light EL therethrough.

Furthermore, if a high pressure is generated by the flow of the liquid LQ between the substrate P and the optical element at the tip of the projection optical system PL, then instead of making the optical element replaceable, the optical element may be firmly fixed by that pressure so that it does not move.

Furthermore, the present embodiment is constituted so that the liquid LQ is filled between the projection optical system PL and the surface of the substrate P, but may be constituted so that the liquid LQ is filled in a state wherein in which, for example, a cover glass being a plane parallel plate is affixed to the surface of the substrate P.

Furthermore, although the liquid LQ in the present embodiment is water, it may be a liquid other than water; for example, if the light source of the exposure light EL is an F2 laser, then this F2 laser light will not transmit through water, so it would be acceptable to use as the liquid LQ a fluorine based fluid, such as perfluorinated polyether (PFPE) or fluorine based oil, that is capable of transmitting the F2 laser light. In this case, the portion that makes contact with the liquid LQ is treated to make it lyophilic by forming a thin film with a substance having a molecular structure that contains fluorine and that has a small polarity. In addition, it is also possible to use as the liquid LQ one (e.g., cedar oil) that is transparent to the exposure light EL, has the highest possible refractive index, and is stable with respect to the projection optical system PL and the photoresist coated on the surface of the substrate P. In this case, the surface is treated according to the polarity of the liquid LQ used.

Furthermore, the substrate P in each of the abovementioned embodiments is not limited to a semiconductor wafer for fabricating semiconductor devices, and is also applicable to a glass substrate for a display device, a ceramic wafer for a thin film magnetic head, or a mask or the original plate of a reticle (synthetic quartz, silicon wafer) used by an exposure apparatus, and the like.

In addition to a step-and-scan system scanning type exposure apparatus (scanning stepper) that scans and exposes the pattern of the mask M by synchronously moving the mask M and the substrate P, a step-and-repeat system projection exposure apparatus (stepper) that exposes the full pattern of the mask M with the mask M and the substrate P in a stationary state and sequentially steps the substrate P is also applicable as the exposure apparatus EX. In addition, the present invention is also applicable to a step-and-stitch system exposure apparatus that partially and superimposingly transfers at least two patterns onto the substrate P.

In addition, the present invention is also applicable to an exposure apparatus that employs a full wafer exposure system that exposes a reduced image of a first pattern onto the substrate P using a projection optical system (e.g., a refraction type projection optical system with a ⅛ reduction magnification and that does not include a reflecting element) in a state in which the first pattern and the substrate P are substantially stationary. In this case, the present invention can also be applied to a stitching full-wafer exposure apparatus that subsequently further uses that projection optical system to perform a full-wafer exposure of the reduced image of a second pattern, in a state in which the second pattern and the substrate P are substantially stationary, onto the substrate P, partially overlapping the first pattern.

The present invention is also applicable to a twin stage type exposure apparatus as recited in, for example, Japanese Published Patent Application No. H10-163099, Japanese Published Patent Application No. H10-214783, and the corresponding U.S. Pat. No. 6,400,441; and to Published Japanese translation of PCT (WO) 2000-505958, and the corresponding U.S. Pat. No. 5,969,441 and U.S. Pat. No. 6,262,796. The disclosures of the abovementioned publications and the U.S. Patents are hereby incorporated by reference in their entirety to the extent permitted by the national laws and regulations of the designated states (or elected states) designated by the present international patent application.

In addition, the present invention is also applicable to an exposure apparatus having an exposure stage capable of holding and moving a substrate to be processed, such as a wafer, and a measurement stage having various measuring members and sensors, as disclosed in Japanese Published Patent Application No. H11-135400. The disclosure of the abovementioned publication and the corresponding U.S. Patent are hereby incorporated by reference in their entirety to the extent permitted by the national laws and regulations of the designated states (or elected states) designated by the present international patent application.

In the present embodiment discussed above, a light transmitting type mask that forms a prescribed shielding pattern (or a phase pattern, or a dimming pattern) onto a substrate having light transmitting characteristics, or a light reflection type mask that forms a prescribed reflected pattern onto a substrate having light reflection properties was used, but the present invention is not limited thereto. For example, instead of such a mask, an electronic mask (one type of optical system) may be used that forms a transmittance pattern or a reflected pattern based on digital data of the pattern to be exposed, or that forms a light emitting pattern. Such an electronic mask is disclosed in, for example, U.S. Pat. No. 6,778,257. The disclosure of the abovementioned U.S. Patent is hereby incorporated by reference in its entirety to the extent permitted by the national laws and regulations of the designated states (or elected states) designated by the present international patent application. Furthermore, the electronic mask discussed above is a concept that includes both a non-emissive type image display device and a self luminous type image display device.

In addition, the present invention is also applicable to an exposure apparatus that performs an exposure, called a double beam interference exposure, that exposes a substrate with the interference fringes produced by the interference of a plurality of beams. Such an exposure method and an exposure apparatus are disclosed in, for example, the pamphlet of International Publication WO 01/35168. The disclosure of the abovementioned pamphlet is hereby incorporated by reference in its entirety to the extent permitted by the national laws and regulations of the designated states (or elected states) designated by the present international patent application.

In addition, in the embodiments discussed above, an exposure apparatus is used that locally fills liquid between the projection optical system PL and the substrate P, but the present invention is also applicable to a liquid immersion exposure apparatus that moves a stage, which holds the substrate to be exposed, in a liquid bath, as well as to a liquid immersion exposure apparatus that forms a liquid bath having a prescribed depth on the stage, and holds the substrate therein. The structure and exposure operation of the immersion exposure apparatus that moves the stage that holds the substrate to be exposed in the liquid bath is disclosed in, for example, Japanese Published Patent Application No. H06-124873, and the immersion exposure apparatus that forms a liquid bath of a prescribed depth on the stage and holds the substrate therein is disclosed in, for example, Japanese Published Patent Application No. H10-303114 and U.S. Pat. No. 5,825,043. The disclosures of the abovementioned publications and the U.S. Patent are hereby incorporated by reference in their entirety to the extent permitted by the national laws and regulations of the designated states (or elected states) designated by the present international patent application.

In addition, the exposure apparatus in which the liquid immersion method discussed above is applied is constituted to fill a liquid (pure water) in the space of the optical path on the emission side of the terminal optical member of the projection optical system PL, and then expose a wafer W (the substrate P), but may be constituted so that it fills a liquid (pure water) also in the space of the optical path on the incident side of the terminal optical member of the projection optical system, as disclosed in the pamphlet of International Publication WO 2004/019128. The disclosure of the above cited pamphlet is hereby incorporated by reference in its entirety to the extent permitted by the national laws and regulations of the designated states (or elected states) designated by the present international patent application.

The type of exposure apparatus EX is not limited to semiconductor device fabrication exposure apparatuses that expose the pattern of a semiconductor device on the substrate P, but is also widely applicable to exposure apparatuses for fabricating liquid crystal devices or displays, exposure apparatuses for fabricating thin film magnetic heads, imaging devices (CCD), or reticles and masks, and the like.

If a linear motor is used in the substrate stage PST or the mask stage MST (refer to U.S. Pat. No. 5,623,853 and U.S. Pat. No. 5,528,118), then either an air levitation type that uses an air bearing or a magnetic levitation type that uses Lorentz's force or reactance force may be used. In addition, each of the stages PST, MST may be a type that moves along a guide, or may be a guideless type not provided with a guide. The disclosure of the above cited U.S. Patent is hereby incorporated by reference in its entirety to the extent permitted by the national laws and regulations of the designated states (or elected states) designated by the present international patent application.

For the drive mechanism of each of the stages PST, MST, a planar motor may be used that opposes a magnet unit in which magnets are arranged two dimensionally to an armature unit in which coils are arranged two dimensionally, and drives each of the stages PST, MST by electromagnetic force. In this case, any one among the magnet unit and the armature unit is connected to the stages PST, MST, and the other one of the magnet unit and the armature unit should be provided on the moving surface side of the stages PST, MST.

The reaction force generated by the movement of the substrate stage PST may be mechanically discharged to the floor (ground) using a frame member so that it is not transmitted to the projection optical system PL, as recited in Japanese Published Patent Application No. H08-166475, and the corresponding U.S. Pat. No. 5,528,118. The disclosures of the above cited publication and U.S. Patent are hereby incorporated by reference in their entireties to the extent permitted by the national laws and regulations of the designated states (or elected states) designated by the present international patent application.

In addition, the reaction force generated by the movement of the mask stage MST may be mechanically discharged to the floor (ground) using a frame member so that it is not transmitted to the projection optical system PL, as recited in Japanese Published Patent Application No. H08-330224, and the corresponding U.S. Pat. No. 5,874,820. The disclosures of the above cited publication and U.S. Patent are hereby incorporated by reference in their entireties to the extent permitted by the national laws and regulations of the designated states (or elected states) designated by the present international patent application.

The exposure apparatus EX of the embodiments in the present application as described above is manufactured by assembling various subsystems, including each constituent element recited in the claims of the present application, so that a prescribed mechanical accuracy, electrical accuracy, and optical accuracy are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The assembly process, from the various subsystems to the exposure apparatus includes the mutual mechanical connection of the various subsystems, the wiring and connection of electrical circuits, the piping and connection of the atmospheric pressure circuit, and the like. Naturally, before the process of assembling from these various subsystems to the exposure apparatus, there are processes for assembling each of the individual subsystems. When the assembly process from various subsystems to the exposure apparatus has completed, a comprehensive adjustment is performed to ensure the various accuracies of the exposure apparatus as a whole. Furthermore, it is preferable to manufacture the exposure apparatus in a clean room wherein the temperature, the cleanliness level, and the like, are controlled.

Figure 6:
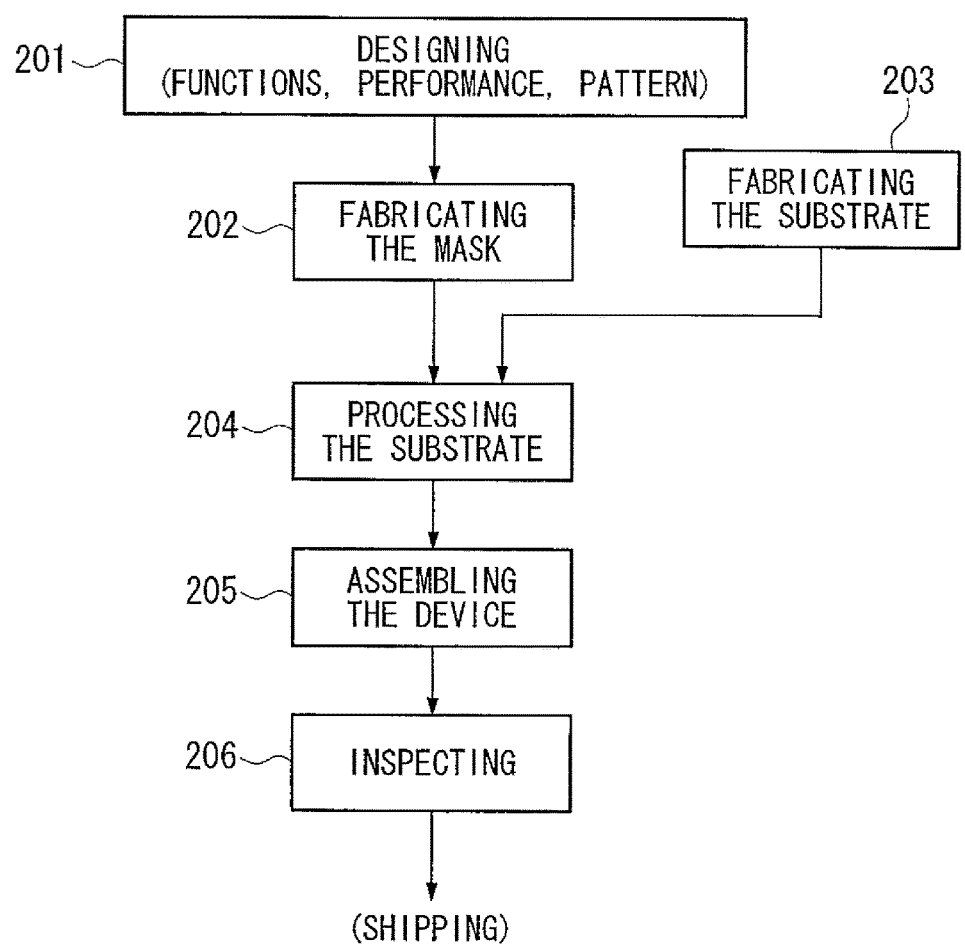
FIG. 6 is a flow chart that depicts one example of the process for fabricating a semiconductor device.

As shown in FIG. 6, a micro-device, such as a semiconductor device is manufactured by: a step 201 that designs the functions and performance of the micro-device; a step 202 that fabricates a mask (reticle) based on this design step; a step 203 that fabricates a substrate, which is the base material of the device; a substrate processing step 204 in which the exposure apparatus EX of the embodiments discussed above exposes a pattern of the mask onto the substrate; a device assembling step 205 (having a dicing process, a bonding process, and a packaging process); a scanning step 206; and the like.

The invention claimed is:

1. An exposure apparatus comprising:
 a projection system having an optical element via which an exposure beam is projected;
 an immersion area forming member having an opening through which the exposure beam is projected, the immersion area forming member having a liquid supply inlet facing downward and a liquid recovery outlet facing downward, relative to an optical axis of the projection system, the liquid supply inlet is located radially outward of the opening and the liquid recovery outlet is located radially outward of the liquid supply inlet so that the liquid supply inlet is disposed between the opening and the liquid recovery outlet;
 a frame by which the projection system and the immersion area forming member are supported;

a first vibration isolator by which transmission of vibration from the frame to the projection system is limited; and a second vibration isolator by which transmission of vibration from the immersion area forming member to the frame is limited, wherein:

a liquid immersion area is formed, using the immersion area forming member, on a portion of an upper surface of a substrate, and the substrate is exposed to the exposure beam through the immersion area forming member.

2. The exposure apparatus according to claim 1, further comprising:

a stage having a holder by which the substrate is held, the stage being movable below the projection system, and the substrate held by the holder being exposed to the exposure beam.

3. The exposure apparatus according to claim 2, wherein an upper surface of the stage that surrounds the holder has a height that is substantially the same as a height of the upper surface of the substrate held by the holder.

4. The exposure apparatus according to claim 2, wherein a gap of 0.1-2.0 mm is provided between an upper surface of the stage that surrounds the holder and an outer edge of the substrate held by the holder.

5. The exposure apparatus according to claim 2, wherein an upper surface of the stage that surrounds the holder includes a repellent surface which has a repellency with respect to a liquid of the liquid immersion area.

6. The exposure apparatus according to claim 5, wherein the repellent surface includes a surface of a thin film made of a liquid repellent material.

7. The exposure apparatus according to claim 1, wherein the immersion area forming member has a loop form and surrounds a lower portion of the projection system.

8. The exposure apparatus according to claim 1, wherein the second vibration isolator includes a drive apparatus that moves the immersion area forming member with respect to the frame.

9. The exposure apparatus according to claim 8, wherein the drive apparatus moves the immersion area forming member in directions of six degrees of freedom.

10. The exposure apparatus according to claim 8, further comprising:

a position measuring instrument that measures a positional relationship between the frame and the immersion area forming member, wherein the drive apparatus moves the immersion area forming member based on a measurement result of the position measuring instrument.

11. The exposure apparatus according to claim 8, further comprising:

a position measuring instrument that measures a positional relationship between the projection system and the immersion area forming member, wherein the drive apparatus moves the immersion area forming member based on a measurement result of the position measuring instrument.

12. The exposure apparatus according to claim 8, wherein the immersion area forming member is movable by the drive apparatus in a direction parallel to the optical axis of the projection system.

13. The exposure apparatus according to claim 8, wherein the immersion area forming member is movable by the drive apparatus in a direction perpendicular to the optical axis of the projection system.

14. The exposure apparatus according to claim 8, wherein the immersion area forming member is rotatable by the drive apparatus.

15. The exposure apparatus according to claim 14, wherein the immersion area forming member is rotatable by the drive apparatus around an axis parallel to the optical axis of the projection system.

16. The exposure apparatus according to claim 14, wherein the immersion area forming member is rotatable by the drive apparatus around an axis perpendicular to the optical axis of the projection system.

17. The exposure apparatus according to claim 8, further comprising a position measurement system configured to obtain positional information of the immersion area forming member.

18. The exposure apparatus according to claim 17, wherein the position measurement system includes an encoder.

19. The exposure apparatus according to claim 17, wherein the position measurement system obtains the positional information of the immersion area forming member in a direction parallel to the optical axis of the projection system.

20. The exposure apparatus according to claim 17, wherein the position measurement system obtains the positional information of the immersion area forming member in a direction perpendicular to the optical axis of the projection system.

21. The exposure apparatus according to claim 17, wherein the position measurement system obtains the positional information of the immersion area forming member in a direction around an axis.

22. The exposure apparatus according to claim 17, wherein the position measurement system obtains the positional information of the immersion area forming member in a direction around an axis parallel to the optical axis of the projection system.

23. The exposure apparatus according to claim 17, wherein the position measurement system obtains the positional information of the immersion area forming member in a direction around an axis perpendicular to the optical axis of the projection system.

24. The exposure apparatus according to claim 17, further comprising a controller which controls the drive apparatus such that the immersion area forming member is moved by the drive apparatus based on the positional information of the immersion area forming member obtained by using the position measurement system.

25. A device manufacturing method comprising:

exposing a substrate using the exposure apparatus of claim 1, and processing the exposed substrate.

26. An exposure apparatus comprising:

a projection system having an optical element via which an exposure beam is projected;

an immersion area forming member having an opening through which the exposure beam is projected, the immersion area forming member having a liquid supply inlet facing downward and a liquid recovery outlet facing downward, relative to an optical axis of the projection system, the liquid supply inlet is located radially outward of the opening and the liquid recovery outlet is located radially outward of the liquid supply inlet so that the liquid supply inlet is disposed between the opening and the liquid recovery outlet;

a frame by which the projection system and the immersion area forming member are supported;

a first vibration isolator disposed between the frame and the projection system; and a second vibration isolator disposed between the immersion area forming member and the frame, wherein:

a liquid immersion area is formed, using the immersion area forming member, on a portion of an upper surface of a substrate, and the substrate is exposed to the exposure beam through the immersion area forming member.

27. The exposure apparatus according to claim 26, further comprising:

a stage having a holder by which the substrate is held, the stage being movable below the projection system, and the substrate held by the holder being exposed to the exposure beam.

28. The exposure apparatus according to claim 27, wherein an upper surface of the stage that surrounds the holder has a height that is substantially the same as a height of the upper surface of the substrate held by the holder.

29. The exposure apparatus according to claim 27, wherein a gap of 0.1-2.0 mm is provided between an upper surface of the stage that surrounds the holder and an outer edge of the substrate held by the holder.

30. The exposure apparatus according to claim 27, wherein an upper surface of the stage that surrounds the holder includes a repellent surface which has a repellency with respect to a liquid of the liquid immersion area.

31. The exposure apparatus according to claim 30, wherein the repellent surface includes a surface of a thin film made of a liquid repellent material.

32. The exposure apparatus according to claim 26, wherein the immersion area forming member has a loop form and surrounds a lower portion of the projection system.

33. The exposure apparatus according to claim 26, wherein the second vibration isolator includes a drive apparatus that moves the immersion area forming member with respect to the frame.

34. The exposure apparatus according to claim 33, wherein the drive apparatus moves the immersion area forming member in directions of six degrees of freedom.

35. The exposure apparatus according to claim 33, further comprising:

a position measuring instrument that measures a positional relationship between the frame and the immersion area forming member, wherein the drive apparatus moves the immersion area forming member based on a measurement result of the position measuring instrument.

36. The exposure apparatus according to claim 33, further comprising:

a position measuring instrument that measures a positional relationship between the projection system and the immersion area forming member, wherein the drive apparatus moves the immersion area forming member based on a measurement result of the position measuring instrument.

37. The exposure apparatus according to claim 33, wherein the immersion area forming member is movable by the drive apparatus in a direction parallel to the optical axis of the projection system.

38. The exposure apparatus according to claim 33, wherein the immersion area forming member is movable by the drive apparatus in a direction perpendicular to the optical axis of the projection system.

39. The exposure apparatus according to claim 33, wherein the immersion area forming member is rotatable by the drive apparatus.

40. The exposure apparatus according to claim 39, wherein the immersion area forming member is rotatable by the drive apparatus around an axis parallel to the optical axis of the projection system.

41. The exposure apparatus according to claim 39, wherein the immersion area forming member is rotatable by the drive apparatus around an axis perpendicular to the optical axis of the projection system.

42. The exposure apparatus according to claim 33, further comprising a position measurement system configured to obtain positional information of the immersion area forming member.

43. The exposure apparatus according to claim 42, wherein the position measurement system includes an encoder.

44. The exposure apparatus according to claim 42, wherein the position measurement system obtains the positional information of the immersion area forming member in a direction parallel to the optical axis of the projection system.

45. The exposure apparatus according to claim 42, wherein the position measurement system obtains the positional information of the immersion area forming member in a direction perpendicular to the optical axis of the projection system.

46. The exposure apparatus according to claim 42, wherein the position measurement system obtains the positional information of the immersion area forming member in a direction around an axis.

47. The exposure apparatus according to claim 42, wherein the position measurement system obtains the positional information of the immersion area forming member in a direction around an axis parallel to the optical axis of the projection system.

48. The exposure apparatus according to claim 42, wherein the position measurement system obtains the positional information of the immersion area forming member in a direction around an axis perpendicular to the optical axis of the projection system.

49. The exposure apparatus according to claim 42, further comprising a controller which controls the drive apparatus such that the immersion area forming member is moved by the drive apparatus based on the positional information of the immersion area forming member obtained by using the position measurement system.

50. A device manufacturing method comprising:

exposing a substrate using the exposure apparatus of claim 26, and processing the exposed substrate.

51. An exposure method comprising:

forming a liquid immersion area on a portion of an upper surface of a substrate using an immersion area forming member having an opening through which an exposure beam is projected, the immersion area forming member having a liquid supply inlet facing downward and a liquid recovery outlet facing downward; and exposing the substrate to the exposure beam by projecting the exposure beam through a projection system having an optical element and through the liquid immersion area formed by the immersion area forming member, wherein relative to an optical axis of the projection system, the liquid supply inlet is located radially outward of the opening and the liquid recovery outlet is located radially outward of the liquid supply inlet so that the liquid supply inlet is disposed between the opening and the liquid recovery outlet, the projection system and the immersion area forming member are supported by a frame, a first vibration isolator limits transmission of vibration from the frame to the projection system, and a second vibration isolator limits transmission of vibration from the immersion area forming member to the frame.

52. The exposure method according to claim 51, wherein: the substrate is held by a holder of a stage, the stage being movable below the projection system, and the substrate held by the holder being exposed to the exposure beam.

53. The exposure method according to claim 52, wherein an upper surface of the stage that surrounds the holder has a height that is substantially the same as a height of the upper surface of the substrate held by the holder.

54. The exposure method according to claim 52, wherein a gap of 0.1-2.0 mm is provided between an upper surface of the stage that surrounds the holder and an outer edge of the substrate held by the holder.

55. The exposure method according to claim 52, wherein an upper surface of the stage that surrounds the holder includes a repellent surface which has a repellency with respect to a liquid of the liquid immersion area.

56. The exposure method according to claim 55, wherein the repellent surface includes a surface of a thin film made of a liquid repellent material.

57. The exposure method according to claim 51, wherein the immersion area forming member has a loop form and surrounds a lower portion of the projection system.

58. The exposure method according to claim 51, wherein the second vibration isolator includes a drive apparatus that moves the immersion area forming member with respect to the frame.

59. The exposure method according to claim 58, wherein the drive apparatus moves the immersion area forming member in directions of six degrees of freedom.

60. The exposure method according to claim 58, wherein:
a position measuring instrument measures a positional relationship between the frame and the immersion area forming member, and
the drive apparatus moves the immersion area forming member based on a measurement result of the position measuring instrument.

61. The exposure method according to claim 58, wherein:
a position measuring instrument measures a positional relationship between the projection system and the immersion area forming member, and
the drive apparatus moves the immersion area forming member based on a measurement result of the position measuring instrument.

62. The exposure method according to claim 58, wherein the immersion area forming member is movable by the drive apparatus in a direction parallel to the optical axis of the projection system.

63. The exposure method according to claim 58, wherein the immersion area forming member is movable by the drive apparatus in a direction perpendicular to the optical axis of the projection system.

64. The exposure method according to claim 58, wherein the immersion area forming member is rotatable by the drive apparatus.

65. The exposure method according to claim 64, wherein the immersion area forming member is rotatable by the drive apparatus around an axis parallel to the optical axis of the projection system.

66. The exposure method according to claim 64, wherein the immersion area forming member is rotatable by the drive apparatus around an axis perpendicular to the optical axis of the projection system.

67. The exposure method according to claim 58, wherein a position measurement system obtains positional information of the immersion area forming member.

68. The exposure method according to claim 67, wherein a controller controls the drive apparatus such that the immersion area forming member is moved by the drive apparatus based on the positional information of the immersion area forming member obtained by using the position measurement system.

69. A device manufacturing method comprising:
exposing a substrate using the exposure method of claim 51, and
processing the exposed substrate.

70. An exposure method comprising:
forming a liquid immersion area on a portion of an upper surface of a substrate using an immersion area forming member having an opening through which an exposure beam is projected, the immersion area forming member having a liquid supply inlet facing downward and a liquid recovery outlet facing downward; and
exposing the substrate to the exposure beam by projecting the exposure beam through a projection system having an optical element and through the liquid immersion area formed by the immersion area forming member, wherein
relative to an optical axis of the projection system, the liquid supply inlet is located radially outward of the opening and the liquid recovery outlet is located radially outward of the liquid supply inlet so that the liquid supply inlet is disposed between the opening and the liquid recovery outlet,
the projection system and the immersion area forming member are supported by a frame,
a first vibration isolator is disposed between the frame and the projection system, and
a second vibration isolator is disposed between the immersion area forming member and the frame.

71. The exposure method according to claim 70, wherein: the substrate is held by a holder of a stage, the stage being movable below the projection system, and the substrate held by the holder being exposed to the exposure beam.

72. The exposure method according to claim 71, wherein an upper surface of the stage that surrounds the holder has a height that is substantially the same as a height of the upper surface of the substrate held by the holder.

73. The exposure method according to claim 71, wherein a gap of 0.1-2.0 mm is provided between an upper surface of the stage that surrounds the holder and an outer edge of the substrate held by the holder.

74. The exposure method according to claim 71, wherein an upper surface of the stage that surrounds the holder includes a repellent surface which has a repellency with respect to a liquid of the liquid immersion area.

75. The exposure method according to claim 74, wherein the repellent surface includes a surface of a thin film made of a liquid repellent material.

76. The exposure method according to claim 70, wherein the immersion area forming member has a loop form and surrounds a lower portion of the projection system.

77. The exposure method according to claim 70, wherein the second vibration isolator includes a drive apparatus that moves the immersion area forming member with respect to the frame.

78. The exposure method according to claim 77, wherein the drive apparatus moves the immersion area forming member in directions of six degrees of freedom.

79. The exposure method according to claim 77, wherein:
a position measuring instrument measures a positional relationship between the frame and the immersion area forming member, and
the drive apparatus moves the immersion area forming member based on a measurement result of the position measuring instrument.

80. The exposure method according to claim 77, wherein:
a position measuring instrument measures a positional relationship between the projection system and the immersion area forming member, and
the drive apparatus moves the immersion area forming member based on a measurement result of the position measuring instrument.

81. The exposure method according to claim 77, wherein the immersion area forming member is movable by the drive apparatus in a direction parallel to the optical axis of the projection system.

82. The exposure method according to claim 77, wherein the immersion area forming member is movable by the drive apparatus in a direction perpendicular to the optical axis of the projection system.

83. The exposure method according to claim 77, wherein the immersion area forming member is rotatable by the drive apparatus.

84. The exposure method according to claim 83, wherein the immersion area forming member is rotatable by the drive apparatus around an axis parallel to the optical axis of the projection system.

85. The exposure method according to claim 83, wherein the immersion area forming member is rotatable by the drive apparatus around an axis perpendicular to the optical axis of the projection system.

86. The exposure method according to claim 77, wherein a position measurement system obtains positional information of the immersion area forming member.

87. The exposure method according to claim 86, wherein a controller controls the drive apparatus such that the immersion area forming member is moved by the drive apparatus based on the positional information of the immersion area forming member obtained by using the position measurement system.

88. A device manufacturing method comprising:
exposing a substrate using the exposure method of claim 70, and
processing the exposed substrate.

* * * * *